US011094265B2

(12) United States Patent
Kato et al.

(10) Patent No.: US 11,094,265 B2
(45) Date of Patent: Aug. 17, 2021

(54) DISPLAY DEVICE

(71) Applicant: Japan Display Inc., Tokyo (JP)

(72) Inventors: Motonari Kato, Tokyo (JP); Ryutaro Nitobe, Tokyo (JP); Norio Mamba, Tokyo (JP)

(73) Assignee: Japan Display Inc., Tokyo (JP)

(*) Notice: Subject to any disclaimer, the term of this patent is extended or adjusted under 35 U.S.C. 154(b) by 0 days.

(21) Appl. No.: 16/818,289

(22) Filed: Mar. 13, 2020

(65) Prior Publication Data

US 2020/0302878 A1 Sep. 24, 2020

(30) Foreign Application Priority Data

Mar. 20, 2019 (JP) .............................. JP2019-052501

(51) Int. Cl.
*G09G 3/3266* (2016.01)
*G02F 1/1362* (2006.01)
*H01L 27/32* (2006.01)
*G09G 3/36* (2006.01)

(52) U.S. Cl.
CPC ..... *G09G 3/3266* (2013.01); *G02F 1/136286* (2013.01); *G09G 3/3677* (2013.01); *H01L 27/3218* (2013.01); *H01L 27/3276* (2013.01); *G02F 2201/52* (2013.01)

(58) Field of Classification Search
CPC ................ G09G 3/3266; G09G 3/3677; G02F 1/136286; H01L 27/3218; H01L 27/3276; G03F 2201/52
See application file for complete search history.

(56) References Cited

U.S. PATENT DOCUMENTS 8,681,081 B2 * 3/2014 Tsuda .................. G09G 3/3688
345/88

FOREIGN PATENT DOCUMENTS

| JP | 2008170687 A | 7/2008 |
| JP | 2009075279 A | 4/2009 |
| WO | 2006009038 A1 | 1/2006 |

* cited by examiner

Primary Examiner — Kenneth B Lee, Jr.
(74) Attorney, Agent, or Firm — K&L Gates LLP

(57) ABSTRACT

A display device capable of suppressing the display quality deterioration is provided even if an optically transparent nondisplay area is formed inside the display area of the display panel of the display device. The display device comprises a display panel including signal lines, scanning lines, and pixels that are connected to the signal lines and scanning lines and surrounded by the signal lines and scanning lines. The display panel includes a display area and an optically transparent nondisplay area inside the display area, and a drive circuit for driving the signal lines. The drive circuit includes at least one of a first drive scheme wherein drive voltages are set smaller as distances between adjacent signal lines corresponding to the drive circuit are shorter, a second drive scheme in which the rising speed of drive waveforms are set smaller as distances between adjacent signal lines corresponding to the drive circuit are shorter, and a third drive scheme in which drive times are set longer as distances between adjacent signal lines corresponding to the drive circuit are shorter.

15 Claims, 17 Drawing Sheets

$C1_{n-4}, C1_{n-3}, C1_{n-2} > C1_1, C1_2, C1_{n-1}, C1_n$

DISPLAY DEVICE

CLAIM OF PRIORITY

The present application claims priority from Japanese Patent Application JP 2019-52501 filed on Mar. 20, 2019, the content of which is hereby incorporated by reference into this application.

BACKGROUND OF THE INVENTION

The present invention relates to display devices and, more particularly, the present invention can be applied to a display device having an optically transparent nondisplay area within the display area thereof.

BACKGROUND ART

An active matrix type display device having high display quality that is realized by reducing the display quality degradation thereof caused by parasitic capacitors and the like, and a drive control circuit used for the active matrix type display device are proposed (Refer to WO 06/009038).

Alternatively, a technology using which, in a liquid crystal display device of a selector drive scheme, the improvement of longitudinal stripes is realized by alleviating the differences among influences owing to couplings caused by parasitic capacitors among signal lines is also proposed (Refer to Japanese Unexamined Patent Application Publication No. 2009-75279).

In addition, a technology using which longitudinal stripes, which occur when image signals are written, owing to couplings caused by parasitic capacitors between adjacent signal lines are suppressed is proposed (Refer to Japanese Unexamined Patent Application Publication No. 2008-170687).

SUMMARY OF THE INVENTION

In recent years, there are cases where an optically transparent nondisplay area is formed inside the display panel of a display device adopted by a mobile apparatus such as a smartphone in order to dispose a camera, a sensor, and the like in the optically transparent area. This nondisplay area is an area where pixels are not arranged, so that this nondisplay area can also be referred to as a non-driven section. This nondisplay area is often formed, for example, inside the display area of a display panel as a circular hole section viewed in a planar perspective. In this case, signal lines for writing pixel voltages are disposed in the periphery of the hole section area so that the signal lines go around or bypass the hole section area. Therefore, there are differences between coupling amounts generated between adjacent signal lines that are disposed in the periphery of the hole section area and coupling amounts generated between adjacent signal lines that are disposed in areas other than the periphery of the hole section area. The differences between these coupling amounts generate differences among coupling potentials. There are cases where the differences among these coupling potentials are displayed as band-like stripes along the disposal directions of the signal lines in the display area of the display panel, which causes the display quality deterioration of the display device.

An object of the present invention is to provide a display device capable of suppressing the display quality deterioration even if an optically transparent nondisplay area is formed inside the display area of the display panel of the display device.

Problems other than the above and new features will be explicitly shown by the descriptions of this specification and the accompanying drawings.

The outline of a typical embodiment of the present invention will briefly be explained as follows.

To put it concretely, a display device includes a display panel including plural signal lines, plural scanning lines, and plural pixels that are connected to the plural signal lines and the plural scanning lines and surrounded by the plural signal lines and the plural scanning lines. The display panel includes a display area and an optically transparent nondisplay area inside the display area, and a drive circuit for driving the plural signal lines. The drive circuit includes at least one drive scheme of a first drive scheme in which the drive circuit makes drive voltages smaller as distances between adjacent signal lines corresponding to the drive circuit are shorter, a second drive scheme in which the drive circuit makes the rising speed of drive waveforms smaller as distances between adjacent signal lines corresponding to the drive circuit are shorter, and a third drive scheme in which the drive circuit makes drive times longer as distances between adjacent signal lines corresponding to the drive circuit are shorter.

DETAILED DESCRIPTION OF THE PREFERRED EMBODIMENTS

Figure 1:
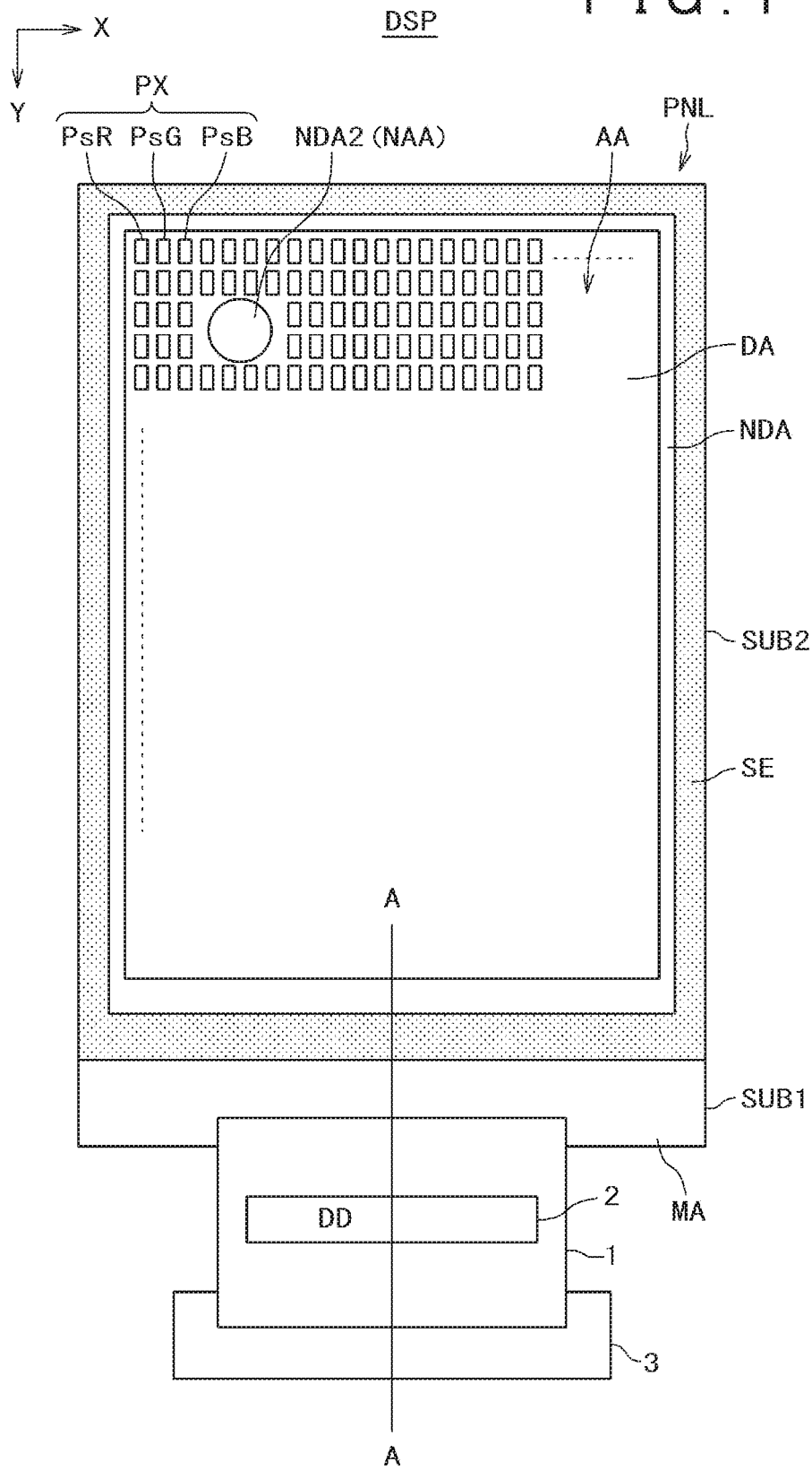
FIG. 1 is a plan view for explaining a display device according to a working example.

Respective embodiments of the present invention will be explained with reference to the accompanying drawings below.

Here, disclosures to be hereinafter described are only examples, and it is apparent that alternations that can be conceived easily within the gist of the invention by those skilled in the art fall within the scope of the present invention. Furthermore, there are cases where, in order to make distinct explanations, the widths, thicknesses, shapes, and the like of the drawings are schematically depicted differently from those of actual working examples, and the drawings show only examples and do not limit the interpretation of the present invention.

In addition, in this specification and the respective drawings, components similar to those explained in the already-described drawings are given the same reference signs, and detailed description about them might be omitted.

In this embodiment, a liquid crystal display device is disclosed as an example of a display device. This liquid crystal display device can be used for various devices such as a smartphone, a tablet terminal, a mobile phone terminal, a personal computer, a TV receiver, and a game machine.

In this specification and the following claims, the terms "upper", "lower", and the like used for explaining the drawings represent the positional relation of a structure to which attention is payed relative to another structure. To put it concretely, in the case where the liquid crystal display device is viewed from the lateral side thereof, a direction from a first substrate (an array substrate) to a second substrate (an opposite substrate) is defined as the "upward" direction, and the opposite direction of the "upward" direction is defined as the "downward" direction.

Furthermore, the terms "inside" and "outside" represent relative positional relations between two portions using a display area as a reference object. In other words, the term "inside" indicates the side of one portion nearer to the display area relative to the other portion, and the term "outside" indicates the side of the other portion farther from the display area relative to the one portion. It will be assumed, however, that the definitions of the terms "inside" and "outside" are made regarding the liquid crystal display device that is not in the state of being folded.

A "display device" denotes a general display device that displays images using a display panel. A "display panel" denotes a structure that display images using electro-optic layers. For example, the term "display panel" might denote a display cell including electro-optic layers, or it might denote a structure including display cells on which other optical members (for example, a polarization member, a back light, a touch panel, and the like) are mounted. Here, an "electro-optic layer" includes a liquid crystal layer, an electro-chromic (EC) layer, an organic light-emitting diode (OLED), a micro LED (µLED), and the like if these components do not technically interfere with one another. Therefore, just because a liquid crystal panel including a liquid crystal layer will be explained as an example of a display panel in the after-mentioned embodiment, it does not mean that a display panel including any one or some of the abovementioned electro-optic layers other than a liquid crystal layer cannot be used for a display panel.

Embodiment

Figure 2:
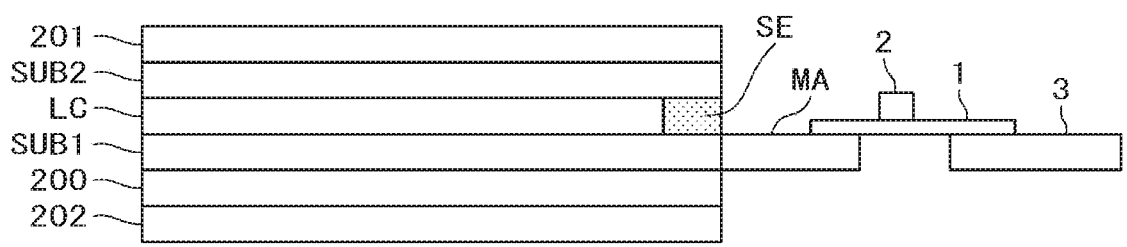
FIG. 2 is a cross sectional view taken along the line A-A shown in FIG. 1.
Figure 3:
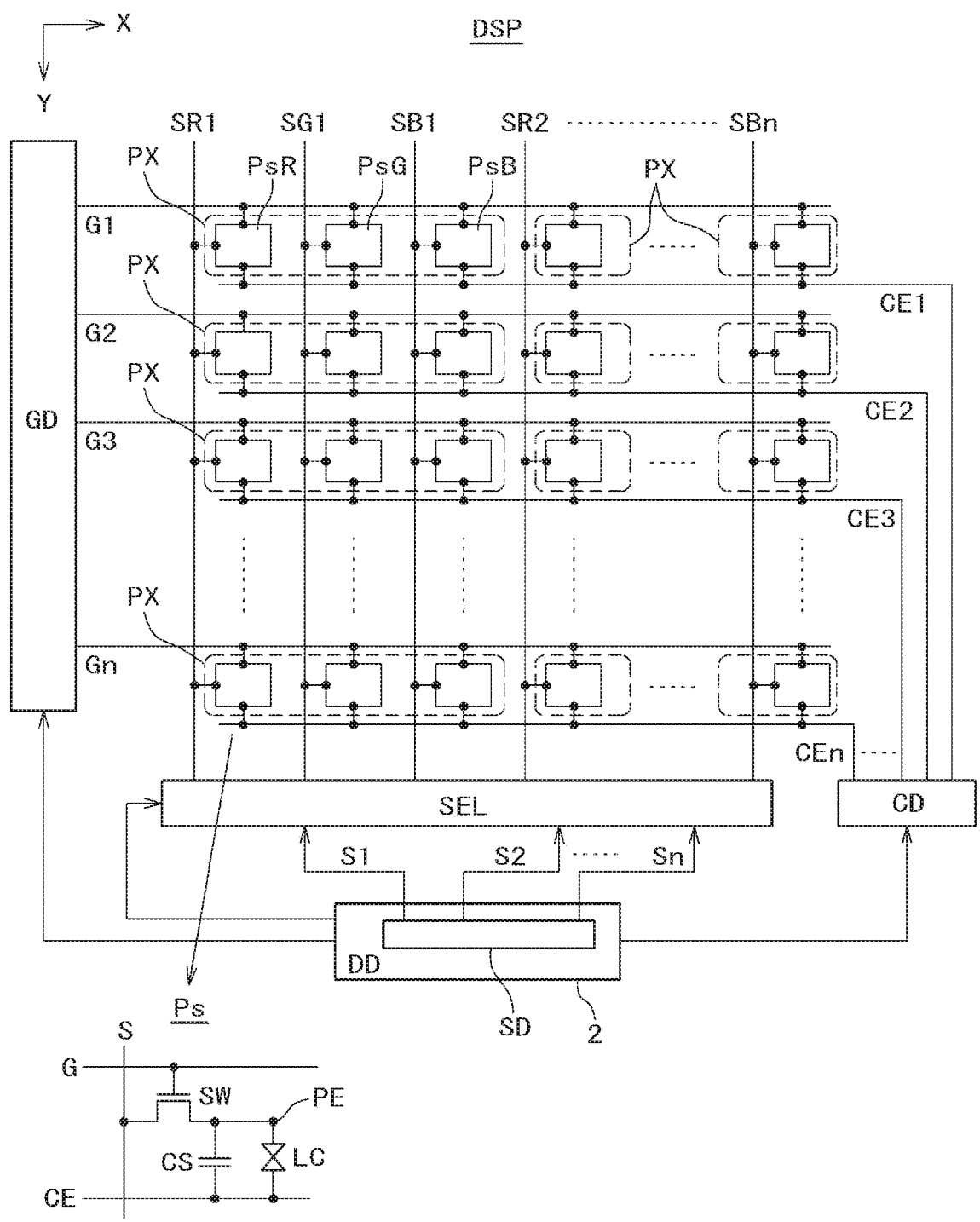
FIG. 3 is a diagram for explaining the circuit configuration of the display device shown in FIG. 1.
Figure 4:
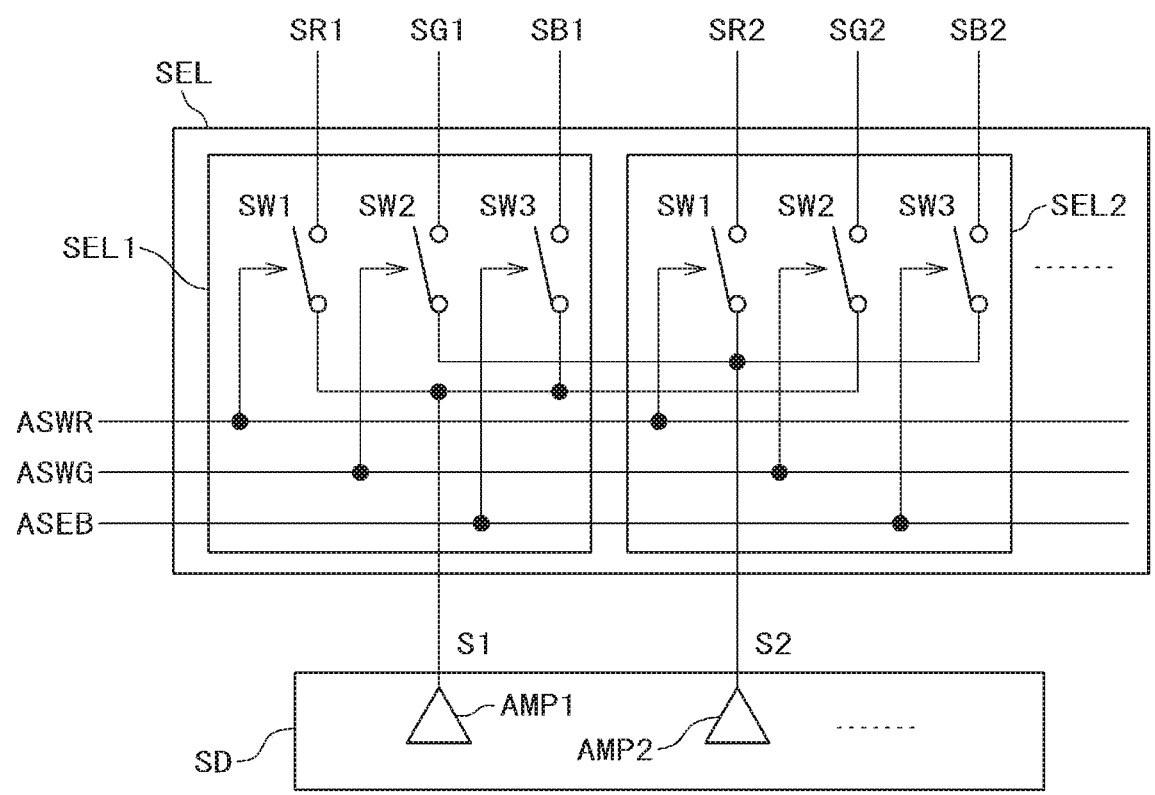
FIG. 4 is a diagram for explaining a signal line selection circuit shown in FIG. 3.
Figure 5:
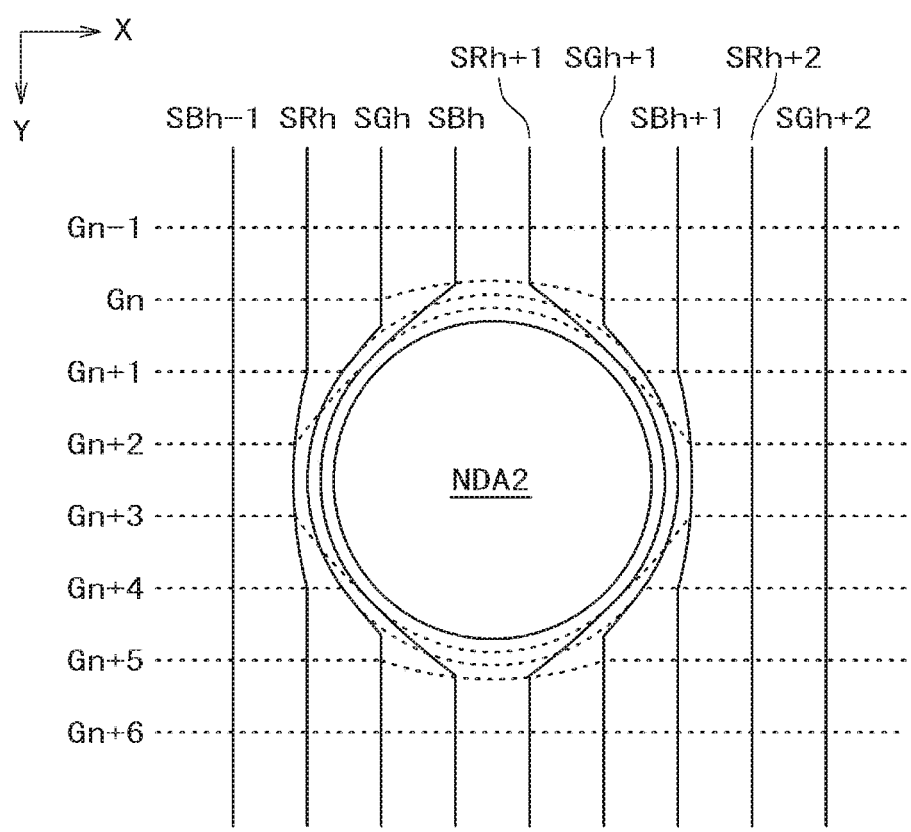
FIG. 5 is an enlarged view for explaining signal lines and scanning lines that bypass the nondisplay area of a display panel shown in FIG. 1.

FIG. 1 is a plan view for explaining a display device according to a working example. FIG. 2 is a cross sectional view taken along the line A-A shown in FIG. 1. FIG. 3 is a diagram for explaining the circuit configuration of the display device shown in FIG. 1. FIG. 4 is a diagram for explaining a signal line selection circuit shown in FIG. 3. FIG. 5 is an enlarged view for explaining signal lines and scanning lines that bypass the nondisplay area such as a hole section of a display panel shown in FIG. 1.

(Entire Configuration Example of Display Device)

As shown in FIG. 1, a display device DSP includes a display panel PNL, a flexible printed circuit substrate 1, an IC chip (DD) 2, and a circuit substrate 3. In this example, the display panel PNL is a liquid crystal display panel, and includes a first substrate (also referred to as an array substrate) SUB1, a second substrate (also referred to as a facing substrate) SUB2, and the after-mentioned liquid crystal layer LC and a seal member SE.

The display panel PNL includes a display section (a display area) DA that displays images and a frame-shaped nondisplay section (a nondisplay area) NDA that surrounds the display section DA. The second substrate SUB2 faces the first substrate SUB1. The first substrate SUB1 includes a mounting section MA that extends further in the second direction Y than the second substrate SUB2 does. The seal member SE is located on the nondisplay section NDA and seals up the liquid crystal layer LC in addition to attaching the first substrate SUB1 to the second substrate SUB2. The nondisplay section NDA can be regarded as a peripheral area, and the mounting section MA can also be regarded as being included in the nondisplay section NDA.

The display section DA includes plural pixels PX and a circular nondisplay area NDA2 as a hole section. The nondisplay area NDA2 is sometimes referred to as a hole section. In the display section DA, the plural pixels PX are disposed in the first direction X and in the second direction Y in a matrix shape in an area other than the nondisplay area NDA2. The nondisplay area NDA2 is formed inside the display section DA, and plural pixels PX are disposed in the periphery of the nondisplay area NDA2. In other words, the display section DA includes a first area (an active area) AA and a second area (a nonactive area) NAA, the first area AA includes the plural pixels PX, and the second area NAA includes the nondisplay area NDA2. The second area NAA is surrounded by the first area AA. Although the nondisplay area NDA2 has a circular shape in a planar perspective in this example, the shape of the nondisplay area NDA2 is not limited to a circular shape. The shape of the nondisplay area NDA2 can be an oval shape or a rectangular shape and the like.

In FIG. 1, one pixel PX is a minimum unit for realizing a color display, and it is referred to as a main pixel. A main pixel PX includes plural subpixels Ps (PsR, PsG, and PsB) that respectively display colors different from one another. As an example, a main pixel PX includes a red pixel PsR for displaying red color, a green pixel PsG for displaying green color, and a blue pixel PsB for displaying blue color as subpixels Ps. It is also conceivable that the main pixel PX further includes a white pixel for displaying white color.

The nondisplay area NDA2 has an area equal to an area occupied by at least one main pixel (three subpixels) or wider or larger. Gate lines (also referred to as scanning lines) avoiding to intersect or cross the nondisplay area NDA2 in the first direction X and image signal lines (also referred to as signal lines) avoiding to intersect or cross the nondisplay area NDA2 in the second direction Y are drawn so that these lines bypass the nondisplay area NDA2. The nondisplay area NDA2 can also be regarded as an optically transparent area. It is also possible to define the nondisplay area NDA2 as an area where a color filter, a thin film transistor, and the like, which include metal wiring layers, semiconductor layers, and colored layers that hinder optical transparency, are not formed. Furthermore, it is also conceivable that wirings composed of optically transparent conductive materials such as light-transmissive ITO (Indium Tin Oxide) are formed in the nondisplay area NDA2. The nondisplay area NDA2 can also be formed as a transparent hole or an opening section formed through the first substrate SUB1 or the second substrate SUB2.

The flexible printed circuit substrate 1 is mounted on the mounting section MA and connected to the circuit substrate 3. The IC chip 2 is mounted on the flexible printed circuit substrate 1. Alternatively, the IC chip 2 can be mounted on the mounting section MA. The IC chip 2 embeds a display driver DD that outputs signals necessary for displaying images in a display mode in which images are displayed.

The display panel PNL of this embodiment can be any of a transparent type display panel having a transparent display function for displaying images by selectively transmitting lights from the back surface of the first substrate SUB1, a reflection type display panel having a reflection display function for displaying images by selectively reflecting lights from the front surface of the second substrate SUB2, and a semi-transparent type display panel having both transparent display function and reflection display function.

Furthermore, although the detailed configuration of the display panel PNL is not described here, the display panel PNL can also have a configuration corresponding to any of a display mode in which a lateral electric field along a main substrate surface is used, a display mode in which a vertical electric field along the normal line of the main substrate surface is used, a display mode in which an oblique electric field that is oblique to the main substrate surface such as optically compensated bend mode is used, and a display mode in which an appropriate combination of the above-mentioned lateral electric field, vertical electric field, and oblique electric field is used. In this case, the main substrate surface is a surface parallel to an X-Y plane defined by the first direction X and the second direction Y.

As shown in FIG. 2, a lower polarization plate 200 is attached to the lower side of the first substrate SUB1, and an upper polarization plate 201 is attached to the upper side of the second substrate SUB2. There are cases where a combination of the first substrate SUB1, the second substrate SUB2, the lower polarization plate 200, the upper polarization plate 201, and the liquid crystal layer LC is referred to as the display panel PNL. If the display panel PNL is a non-light-emitting panel, a backlight 202 is disposed under the lower polarization plate 200.

Plural external terminals are arranged on the mounting section MA. The flexible printed circuit substrate 1 is connected to the plural external terminals of the mounting section MA. The IC chip 2 that provides image signals and the like is mounted on the flexible printed circuit substrate 1. The circuit substrate 3 for providing signals and electric power to the display device DSP from the outside is connected to the flexible printed circuit substrate 1.

In the case where the nondisplay area NDA2 is formed as a transparent hole or an opening section through the first substrate SUB1 and the second substrate SUB2, the transparent hole or the opening section is also formed through the areas of the lower polarization plate 200, the upper polarization plate 201, and the backlight 202 corresponding to the nondisplay area NDA2.

On the other hand, in the case where the nondisplay area NDA2 is an area where a color filter, a thin film transistor, and the like, which include metal wiring layers, semiconductor layers, and colored layers that hinder optical transparency, are not formed, the nondisplay area NDA2 is a comparatively transparent area where plural pixels PX are not disposed, and, for example, a camera or some kinds of sensors are disposed on the nondisplay area NDA2. Therefore, the transparency of the nondisplay area NDA2 is an important factor, and if optical elements such as a polarization plate are disposed in the nondisplay area NDA32, there is a possibility that the transparency is downgraded. Therefore, it is preferable that neither the lower polarization plate 200 nor the upper polarization plate 201 is formed on the nondisplay area NDA2. However, other than the configuration in which optical elements such as the polarization plates 200 and 201 are not formed either on the first substrate SUB1 or on the second substrate SUB2, there can be a configuration where one of the polarization plates (200 and 201) is formed in only one of a part of the first substrate SUB1 and a part of the second substrate SUB2 corresponding to the nondisplay area NDA2, and the other polarization plate (201 or 200) is not formed in the part of the other substrate.

For example, in a configuration where the lower polarization plate 200 is formed in the nondisplay area NDA2 of the first substrate SUB1 and the upper polarization plate 201 is not formed in the nondisplay area NDA2 of the second substrate SUB2, there is a possibility that a hole section of the upper polarization plate 201 punched out by die-cutting along the nondisplay area NDA2 of the second substrate SUB2 is visually recognized by a user. On the other hand, if the lower polarization plate 200 is not formed in the nondisplay area NDA2 of the first substrate SUB1 and the upper polarization plate 201 is formed in the nondisplay area NDA2 of the second substrate SUB2, it becomes more difficult to visually recognize the hole section of the upper polarization plate 201 made along the nondisplay area NDA2. Anyway, a process in which hole sections are formed along the nondisplay areas NDA2 in both polarization plates 200 and 201 is expensive, and by forming a hole section in one of the polarization plates 200 and 201, the total cost for the display device can be reduced while the cost for the above process is suppressed.

(Example of Circuit Configuration of Display Device)

FIG. 3 shows the circuit configuration of the display device DSP and the fundamental configuration of a subpixel.

The plural main pixels PX are disposed in the first direction X and in the second direction Y in a matrix shape. Plural scanning lines (gate lines) G (G1, G2, G3, ..., Gn) are connected to a scanning line drive circuit GD. Plural signal lines (source lines) S (SR1, SG1, SB1, SR2, ..., SBn) are connected to a signal line selection circuit SEL. Plural common electrodes CE (CE1, CE2, CE3, ..., CEn) are connected to a voltage supply unit CD that supplies a common voltage (Vcom), and each of the plural common electrodes CE is disposed for the relevant plural main pixels PX in common. Control signals for controlling the scanning line drive circuit GD, the signal line selection circuit SEL, and the voltage supply unit CD are supplied from the IC chip (DD) 2 that is referred to as a control unit. The signal line selection circuit SEL is configured to receive plural source signals S1, S2, . . . , Sn supplied from a source line drive circuit SD embedded in the IC chip 2.

One main pixel PX includes three subpixels Ps (PsR, PsG, and PsB) for color display. One subpixel Ps is connected to one scanning line G, one signal line S, and one common electrode CE. Here, it is not always necessary that the scanning lines G and the signal lines S should linearly extend, and it is acceptable that parts of those lines are curved. For example, even if a part of a signal line S is curved, it will be assumed that the signal line extends in the second direction Y.

One subpixel Ps includes a switching element SW, a pixel electrode PE, a common electrode CE, a liquid crystal later LC, and the like. The switching element SW is composed of, for example, a thin film transistor (TFT), and electrically connected to a scanning line G and a signal line S (one of SR1, SG1, SB1, . . . ). The scanning line G is electrically connected to the gate electrode of the switching element SW of each of plural subpixels Ps arranged in the first direction X. The signal line S is electrically connected to the source electrode or drain electrode of the switching element SW of each of plural subpixels Ps arranged in the second direction Y. The pixel electrode PE is electrically connected to the source electrode or drain electrode of the switching element SW. The pixel electrode PE faces the common electrode CE, and the liquid crystal layer LC is driven by an electric field generated between the pixel electrode PE and the common electrode CE. A holding capacitor CS is formed, for example, between an electrode the potential of which is equal to that of the common electrode CE and an electrode the potential of which is equal to that of the pixel electrode PE.

FIG. 4 shows an example of a circuit configuration of the signal line selection circuit SEL. The signal line selection circuit SEL includes plural selection circuits SEL1, SEL2, . . . , and each of the selection circuits SEL1, SEL2, . . . includes three switch elements SW1, SW2, and SW3. Each of the switch elements SW1, SW2, and SW3 can be composed of an analog switch including a P channel type transistor and an N channel type transistor the source-drain routes of which are connected in parallel, or can be composed of a switch formed by either a P channel type transistor or an N channel type transistor. The on-operation and off-operation of the switch element SW1 is controlled by a selection signal ASWR. The on-operation and off-operation of the switch element SW2 is controlled by a selection signal ASWG. The on-operation and off-operation of the switch element SW3 is controlled by a selection signal ASWB. The selection signals ASWR, ASWG, and ASWB are control signals supplied from the IC chip 2 to the signal line selection circuit SEL.

The on-operation of the switch element SW1 puts signal lines SR1 and SR2 connected to red pixels PsR in a selected state respectively. With this, a source signal S1 is supplied to the signal line SR1 from a source amplifier AMP1 in the source line drive circuit SD, and a source signal S2 is supplied to the signal line SR2 from a source amplifier AMP2 in the source line drive circuit SD. Source amplifiers AMP (AMP1, AMP2, . . . ) can be referred to as source drivers or drive circuits.

The on-operation of switch element SW2 puts signal lines SG1 and SG2 connected to green pixels PsG in a selected state respectively. With this, the source signal S2 is supplied to the signal line SG1 from the source amplifier AMP2, and the source signal S1 is supplied to the signal line SG2 from the source amplifier AMP1.

The on-operation of switch element SW3 puts signal lines SB1 and SB2 connected to blue pixels PsB in a selected state respectively. With this, the source signal S1 is supplied to the signal line SB1 from the source amplifier AMP1, and the source signal S2 is supplied to the signal line SB2 from the source amplifier AMP2.

For example, in the case where color display data (green data, red data, and blue data) for one line are written into plural subpixels, which are connected to the scanning line G1, for the one line, first the selection signal ASWR is temporarily put in a selection level, so that the switch element SW1 is turned on. Next, the selection signal ASWG is temporarily put in a selection level, so that the switch element SW2 is turned on, and lastly the selection signal ASWB is temporarily put in a selection level, so that the switch element SW3 is turned on. Such an operation is repeated as many times as the number of plural scanning lines G, so that display data used for one frame of the display panel PNL can be written into the plural pixels PX. In other words, three subpixels Ps (PsR, PsG, and PsB) are time-divisionally driven by the switch elements SW1, SW2, and SW3 respectively.

Here, with reference to FIG. 4, a connection configuration composed of six signal lines (SR1, SG1, SB1, SR2 SG2, and SB2), two selection circuits (SEL1 and SEL2), and two source amplifiers (AMP1, AMP2) is regarded as one unit circuit, and plural unit circuits are formed in the signal line selection circuit SEL and the source line drive circuit SD so that the plural unit circuits correspond to plural signal lines S.

As shown in FIG. 5, signal lines SRh, SGh, and SBh are disposed with appropriate gaps therebetween along the left side of the nondisplay area NDA2 while curving without having contact with one another in a planar perspective so that these signal lines bypass the nondisplay area NDA2. Similarly, signal lines SRh+1, SGh+1, and SBh+1 are disposed with appropriate gaps therebetween along the right side of the nondisplay area NDA2 while curving without having contact with one another in a planar perspective so that these signal lines bypass the nondisplay area NDA2. On the other hand, signal lines SBh−1, SRh+2, and SGh+2 are linearly disposed along the Y direction without curving.

Therefore, because the signal lines SRh, SGh, and SBh and the signal lines SRh+1, SGh+1, and SBh+1 bypass the nondisplay area NDA2, gaps between parts of these signal lines that curve to bypass the nondisplay area NDA2 are set narrow. As a result, coupling capacitors between the signal lines SRh, SGh, SBh, SRh+1, SGh+1, SBh+1, and their adjacent signal lines are larger than coupling capacitors between the signal lines SBh−1, SBh+2 and their adjacent signal lines. The differences between coupling capacitors are generated by the differences between the relevant coupling amounts, and the differences between the coupling capacitors generate differences between the relevant coupling voltage potentials.

Furthermore, scanning lines Gn, Gn+1, and Gn+2 are disposed with appropriate gaps therebetween along the upper side of the nondisplay area NDA2 while curving without having contact with one another in a planar perspective so that these scanning lines bypass the nondisplay area NDA2. Similarly, scanning lines Gn+3, Gn+4, and Gn+5 are disposed with appropriate gaps therebetween along the lower side of the nondisplay area NDA2 while curving without having contact with one another in a planar perspective so that these scanning lines bypass the nondisplay area NDA2. On the other hand, scanning lines Gn−1 and Gn+6 are linearly disposed along the X direction without curving.

In FIG. 5, in order to simplify the drawing and make understanding of the drawing easy, subpixels connected to the signal lines SBh−1 to SRh+2 and the scanning lines Gn−1 to Gn+6 are not depicted. The subpixels are connected to the signal lines SBh−1 to SRh+2 and the scanning lines Gn−1 to Gn+6 in such a way that one subpixel is connected to one signal line and one scanning line. In other words, it can be regarded that the plural subpixels are surrounded by the plural signal lines S and the plural scanning lines G. However, no subpixels are formed in an area surrounded by the signal lines SRh to SBh+1 and the scanning lines Gn to Gn+5 (the nondisplay area NDA2 and an area surrounding the nondisplay area NDA2). In this example, twenty-five subpixels are not formed in an area surrounded by the signal lines SRh to SBh+1 and the scanning lines Gn to Gn+5.

Figure 6:
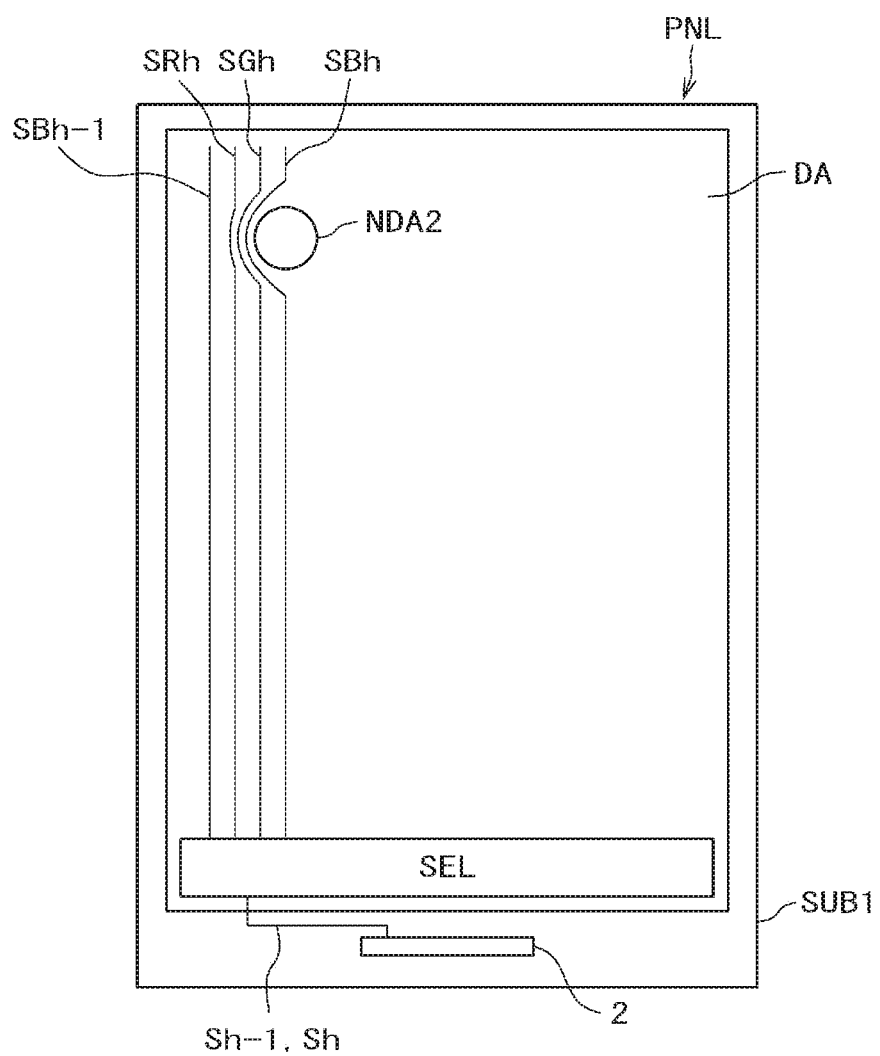
FIG. 6 is a diagram showing the display panel in a simplified way.
Figure 7:
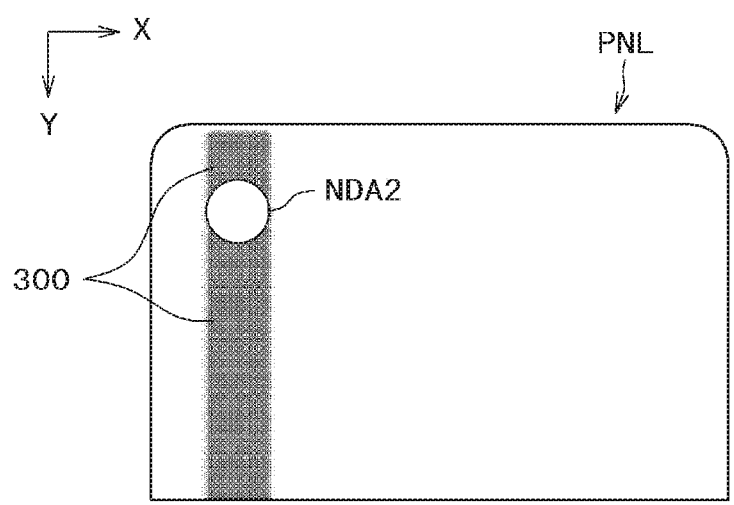
FIG. 7 is a diagram showing band-like stripes that appear to the upper side and the lower side of the nondisplay area.
Figure 8:
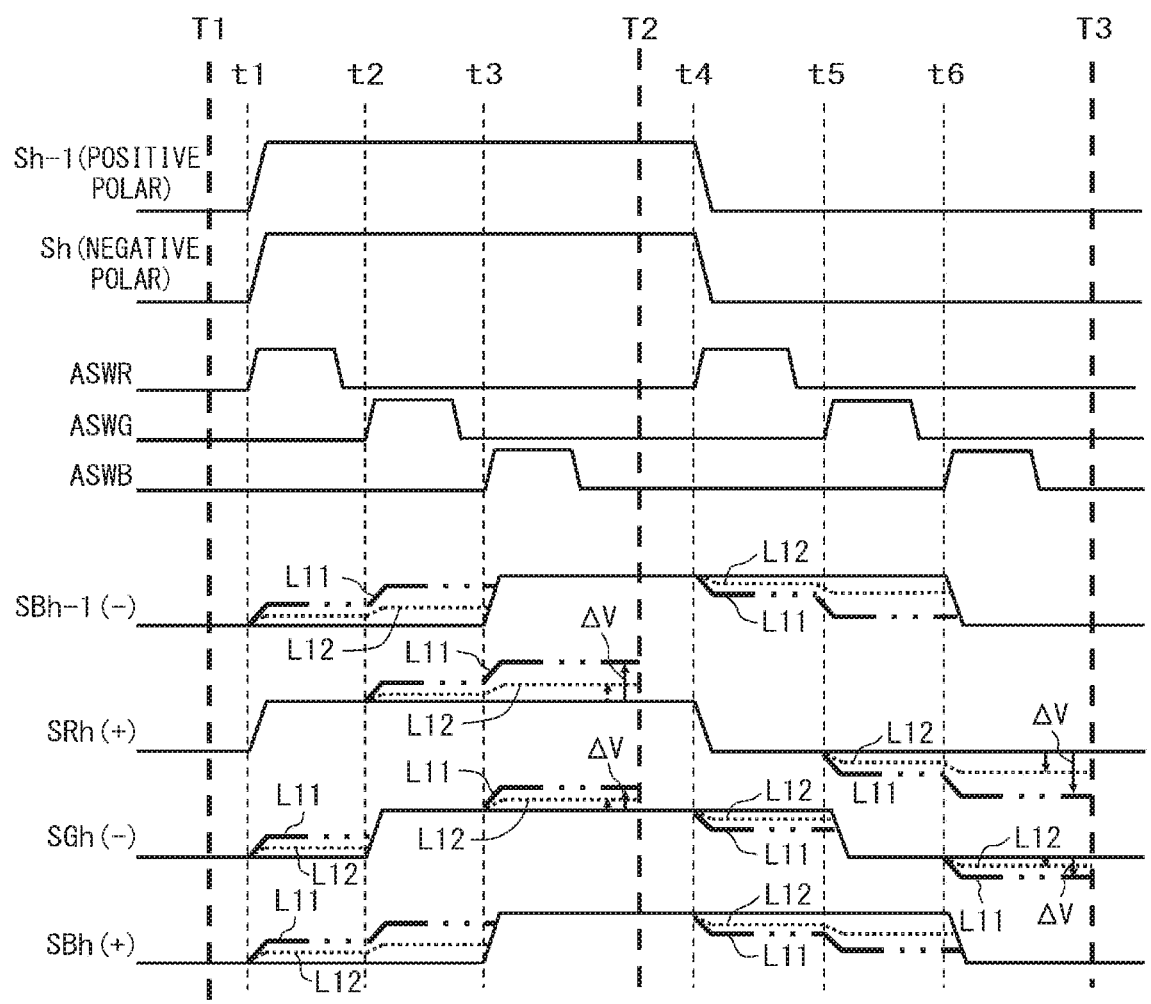
FIG. 8 is a diagram for explaining the changes of the signal potentials of signal lines according to a comparative example.

Next, the operation of the display panel will be explained with reference to FIG. 6 to FIG. 8. FIG. 6 is a diagram showing the display panel in a simplified way. FIG. 7 is a diagram showing band-like stripes that appear on the upper side and the lower side of the nondisplay area. FIG. 8 is a diagram for explaining the changes of the signal potentials of signal lines according to a comparative example. Here, FIG. 6 shows a configuration example of the display panel in which the IC chip 2 is mounted on the first substrate SUB1.

In FIG. 6, the signal lines SBh−1, SRh, SGh, and SBh disposed on the left side of the nondisplay area NDA2, which are explained in FIG. 5, are illustratively shown in the display panel PNL. It will be assumed that source signal Sh−1 and Sh supplied from the IC chip 2 are supplied to the signal lines SBh−1, SRh, SGh, and SBh via the selection circuit SEL. In this case, in the selection circuit SEL shown in FIG. 4, the signal lines SB1, SR2, SG2, and SB2 correspond to the signal lines SBh−1, SRh, SGh, and SBh respectively, and the source signals S1 and S2 correspond to the source signals Sh−1 and Sh respectively.

In FIG. 7, a display example in the display panel PNL shown in FIG. 6 is shown. In this example, the band-like stripes 300 appear in the upper area and the lower area of the nondisplay area NDA2 along the Y direction. These band-like stripes 300 are generated because pixel writing voltages for the subpixels Ps (PsR, PsG, and PsB) disposed in the upper area and the lower area of the nondisplay area NDA2 are different from pixel writing voltages for the subpixels Ps (PsR, PsG, and PsB) disposed in areas other than the upper area and the lower area of the nondisplay area NDA2 owing to time constants, couplings, and the like.

FIG. 8 shows the changes of the pixel writing voltages for plural subpixels Ps disposed in the upper area and the lower area of the nondisplay area NDA2. In FIG. 8, the horizontal axis represents time, and the vertical axis represents the voltages of the respective signals. FIG. 8 shows that, during a period between time T1 and time T2, the pixel voltages of the source signals Sh−1 and Sh are written, for example, into plural subpixels Ps connected to the first scanning line G1. During a period between time T2 and time T3, the pixel voltages of the source signals Sh−1 and Sh are written, for example, into plural subpixels Ps connected to the second scanning line G2. Here, it will be assumed that the source signals Sh−1 and Sh are, for example, positive voltages during the period between time T1 and time T2, and negative voltages between time T2 and time T3. In this example, the source signal Sh−1 is set positive polar, and the source signal Sh is set negative polar, and a situation where both positive polar and negative polar source signals change in the same phase is shown in FIG. 8. In the embodiment shown in FIG. 8, the source signal Sh−1 is set positive polar in column inversion driving, and white writing is executed, so that the potential of the source signal Sh−1 changes from a predefined reference potential to a high potential. On the other hand, the source signal Sh is set negative polar, and black writing is executed, so that the potential of the source signal Sh changes from a low potential to the predefined reference potential. Therefore, the potential of the positive polar source signal Sh−1 and the potential of the negative polar source signal Sh change in the same direction at the same time. Here, the invention according to this application can be applied not only to the above-described column inversion driving but also to any driving in which the potentials of adjacent or neighboring plural source lines change in the same direction.

The selection signal ASWR is temporarily put in the selection level at time t1 during the period between time T1 and time T2 and at time t4 during the period between time T2 and time T3, so that the switch element SW1 is temporarily turned on. In addition, the selection signal ASWG is temporarily put in the selection level at time t2 and at time t5, so that the switch element SW2 is temporarily turned on. Furthermore, the selection signal ASWB is temporarily put in the selection level at time t3 and at time t6, so that the switch element SW3 is temporarily turned on. At these times (time t3 and time t6), the corresponding scanning line is temporarily put in the selection level, the switching element SW of each of plural subpixels Ps connected to the corresponding scanning line is turned on. With this, the potentials of the corresponding signal lines S (SBh−1, SRh, SGh, and SBh) are written into the plural subpixels Ps connected to the corresponding scanning lines as pixel writing voltages.

In FIG. 8, bold chain double-dashed lines L11 show the signal line potentials of the signal lines SBh−1, SRh, SGh, and SBh that change owing to couplings between the signal lines SBh−1, SRh, SGh, SBh, and adjacent signal lines in the case where there is the nondisplay area NDA2. On the other hand, dashed lines L12 show signal line potentials of the signal lines SBh−1, SRh, SGh, and SBh that change owing to couplings between the signal lines SBh−1, SRh, SGh, SBh, and adjacent signal lines in the case where there is not the nondisplay area NDA2.

At time t1, when the selection signal ASWR is temporarily put in the selection level, and the switch element SW1 is temporarily turned on, the potential of the signal line SRh is changed from the predefined substantially-low level potential of the source signal Sh to the predefined substantially-high level potential of the source signal Sh. With this, the potentials of the signal lines SBh−1, SGh, and SBh are raised from the low level as shown by bold chain double-dashed lines L11. The changes of these potentials are caused by a coupling capacitor between the signal line SRh and the signal line SBh−1, a coupling capacitor between the signal line SRh and the signal line SGh, and a coupling capacitor between the signal line SBh and the signal line SRh+1 (not shown).

At time t2, when the selection signal ASWG is temporarily put in the selection level, and the switch element SW2 is temporarily turned on, the potential of the signal line SGh is changed from a predefined potential shown by a bold chain double-dashed line L11 to the potential of the source signal Sh. With this, the potentials of the signal lines SBh−1, SRh, and SBh are raised as shown by bold chain double-dashed lines L11. The changes of these potentials are caused by a coupling capacitor between the signal line SGh−1 (not shown) and the signal line SBh−1, the coupling capacitor between the signal line SGh and the signal line SRh, and a coupling capacitor between the signal line SGh and the signal line SBh.

At time t3, when the selection signal ASWB is temporarily put in the selection level, and the switch element SW3 is temporarily turned on, the potentials of the signal line SBh−1 and SBh are changed to the substantially-high level predefined potentials of the source signals Sh−1 and Sh. With this, the potentials of the signal lines SRh, and SGh are raised as shown by bold chain double-dashed lines L11. The changes of these potentials are caused by the coupling capacitor between the signal line SRh and the signal line SBh−1, and the coupling capacitor between the signal line SGh and the signal line SBh. As a result, potential shifts ΔV are generated on the signal lines SRh and SGh. The states of these potentials are written into plural subpixels Ps as pixel potentials.

As for a period during time t4 and time t6, potential shifts ΔV are generated on the signal lines SRh and SGh at time t6 for a similar reason. There are cases where the potential shifts ΔV generated on the signal lines SRh and SGh cause the band-like stripes 300 shown in FIG. 7 to occur.

Figure 9:
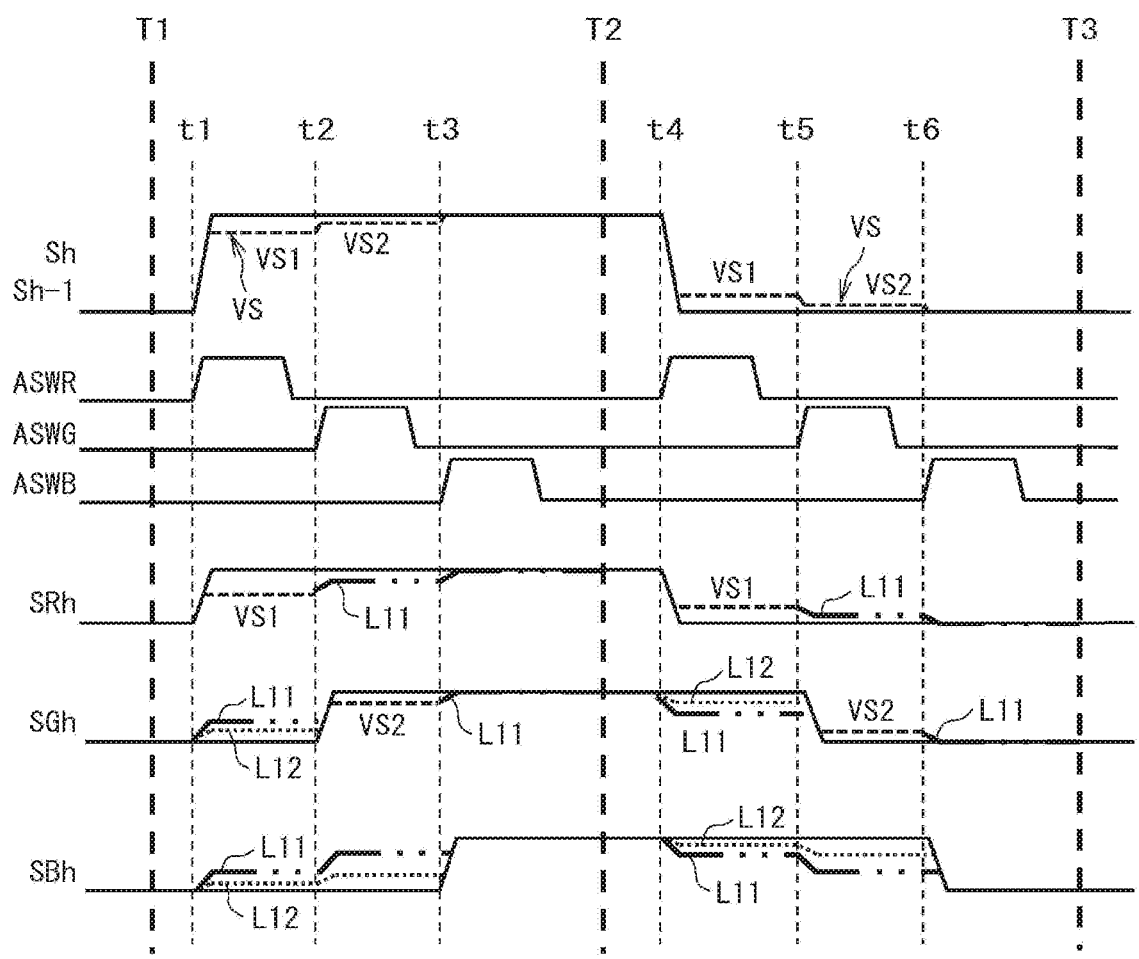
FIG. 9 is a diagram for explaining the changes of the signal potentials of signal lines according to a first drive scheme of the working example.

In FIG. 8, as mentioned above, the dashed lines L12 shows the signal line potentials of the signal lines SBh−1, SRh, SGh, and SBh that change owing to the couplings between the signal lines SBh−1, SRh, SGh, SBh and adjacent signal lines, and their change amounts in the case where there is not the nondisplay area NDA2 are smaller than the change amounts of the signal line potentials (potential shifts ΔV) shown by the bald chain double-dashed lines L11. In other words, the coupling capacitors between the signal lines SBh−1, SRh, SGh, SBh and adjacent signal lines are larger in the case where there is the nondisplay area NDA2. Stated another way, because the signal lines SRh, SGh, SBh and the signal lines SRh+1, SGh+1, and SBh+1, which bypass the nondisplay area NDA2, bypass the nondisplay area NDA2, gaps between parts of these signal lines that curve to bypass the nondisplay area NDA2 are set narrow. Therefore, coupling capacitors between the signal lines SRh, SGh, and SBh, the signal lines SRh+1, SGh+1, SBh+1, and their adjacent signal lines are larger than coupling capacitors between the signal line SBh−1, the signal line SBh+2, and their adjacent signal lines. FIG. 9 is a diagram for explaining the changes of the signal potentials of signal lines according to a first drive scheme of the working example. The first drive scheme is a drive scheme in which the voltages of the source signals Sh, Sh−1 supplied to the signal lines SRh, SGh, and SBh that are wired so as to bypass the nondisplay area NDA2 are corrected. In FIG. 9, dashed lines VS show the corrected voltages of the source signals Sh and Sh−1 (corrected voltages VS1 and VS2). Similarly to FIG. 8, bold chain double-dashed lines L11 show the signal line potentials of the signal lines SRh, SGh, and SBh that change owing to couplings between the signal lines SRh, SGh, SBh, and adjacent signal lines in the case where there is the nondisplay area NDA2. On the other hand, dashed lines L12 show the signal line potentials of the signal lines SRh, SGh, and SBh changed owing to couplings between the signal lines SRh, SGh, SBh, and adjacent signal lines in the case where there is not the nondisplay area NDA2.

In FIG. 9, at time t1, when the selection signal ASWR is temporarily put in the selection level, and the switch element SW1 is temporarily turned on, the potential of the signal line SRh is changed from the predefined substantially-low level potential to the corrected potential VS1 of the source signal Sh. With this, the potentials of the signal lines SGh and SBh are raised as shown by bold chain double-dashed lines L11. The changes of these potentials are caused by a coupling capacitor between the signal line SRh and the signal line SGh−1 (not shown), the coupling capacitor between the signal line SRh and the signal line SGh, and the coupling capacitor between the signal line SBh and the signal line SRh+1 (not shown).

At time t2, when the selection signal ASWG is temporarily put in the selection level, and the switch element SW2 is temporarily turned on, the potential of the signal line SGh is changed from a predefined potential shown by a bold chain double-dashed line L11 to the corrected potential VS2 of the source signal Sh. With this, the potentials of the signal lines SRh and SBh are raised as shown by bold chain double-dashed lines L11. The changes of these potentials are caused by a coupling capacitor between the signal line SRh and the signal line SGh, and the coupling capacitor between the signal line SGh and the signal line SBh. The value of the corrected voltage VS2 is set larger than that of the corrected voltage VS1.

At time t3, when the selection signal ASWB is temporarily put in the selection level, and the switch element SW3 is temporarily turned on, the potential of the signal line SBh is changed to the substantially-high level predefined potential of the source signal Sh. With this, the potentials of the signal lines SRh, and SGh are raised as shown by bold chain double-dashed lines L11. The changes of these potentials are caused by the coupling capacitor between the signal line SRh and the signal line SBh−1 (not shown), and the coupling capacitor between the signal line SGh and the signal line SBh. Potential shifts on the signal lines SRh and SGh can be prevented from being generated.

Similar phenomena as above occur during a period between time t4 to time t6, and, for a similar reason, potential shifts can be prevented from being generated on the signal lines SRh and SGh.

As shown in FIG. 9, the values of the corrected potentials VS1 and VS2, which are drive voltages for the signal lines, are set smaller as the coupling capacitors between the adjacent signal lines become larger. For some image data, there are cases where, because ΔV21 has a negative value, VS1 and VS2 are corrected to a large degree. Therefore, in the first drive scheme, the drive circuit makes drive voltages smaller as distances between adjacent signal lines corresponding to the drive circuit are shorter.

Hereby, the potential shifts ΔV such as shown in FIG. 8 can be prevented from being generated on the signal lines SRh and SGh, so that predetermined potentials can be written into plural subpixels Ps as pixel potentials. Therefore, the band-like stripes 300 shown in FIG. 7 are not generated, and a display quality can be improved.

Next, the correction voltages VS will be explained.

Figure 10:
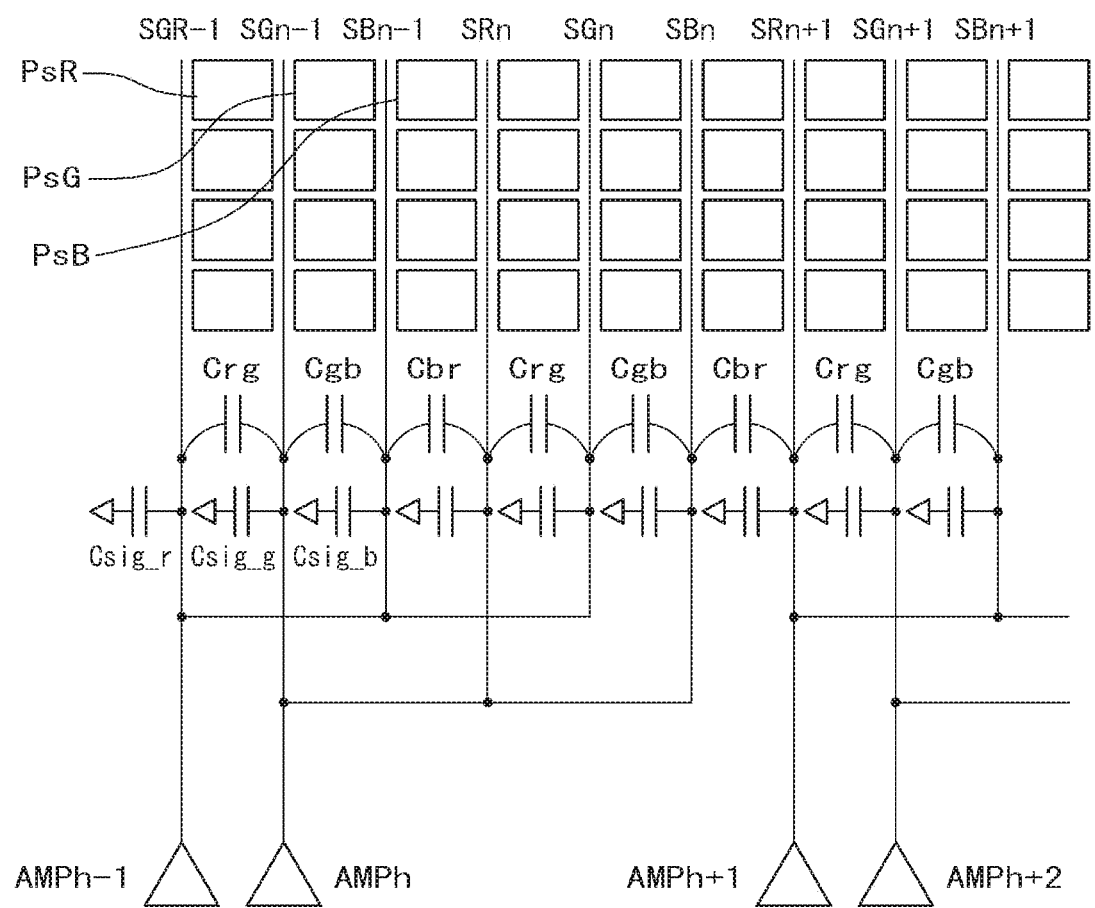
FIG. 10 is a diagram schematically showing parasitic capacitors of signal lines and parasitic capacitors between the signal lines.
Figure 11:
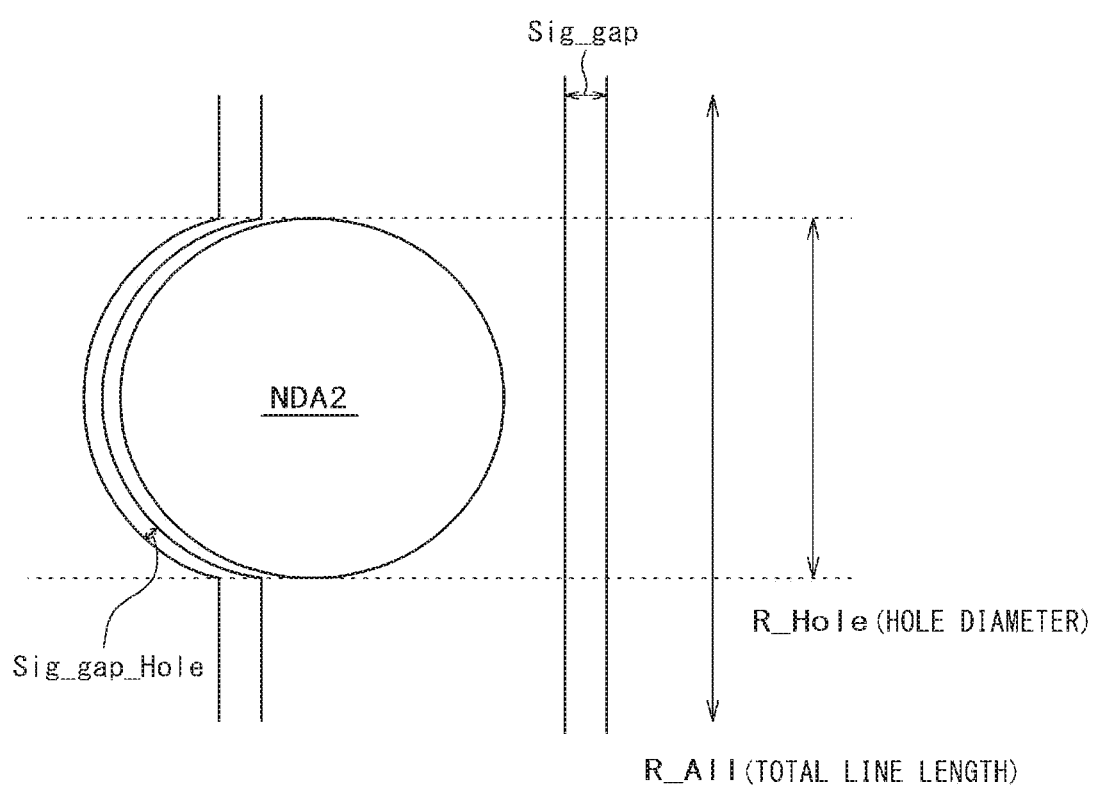
FIG. 11 is a diagram for explaining parasitic capacitors between signal lines that are wired so as to bypass the nondisplay area.

FIG. 10 is a diagram schematically showing parasitic capacitors of signal lines and parasitic capacitors between the signal lines. FIG. 11 is a diagram for explaining parasitic capacitors between signal lines that are wired so as to bypass the nondisplay area NDA2. Here, in FIG. 10, although source amplifiers AMPh−1 to ASMPh+2 are depicted, the signal line selection circuit SEL is not depicted in order to simplify the drawing.

As shown in FIG. 10, it will be assumed that capacitors Csig_r, Csig_g, and Csig_b exist on signal lines SRn−1 to Sbn+1 as the parasitic capacitors of the signal lines. In addition, it will be assumed that there is a capacitor Crg between the signal line SRn−1 (SRn or SRn+1) and the signal line SGn−1 (SGn or SGn+1) as a between-adjacent line capacitor. It will be assumed that there is a capacitor Cgb between the signal line SGn−1 (SGn or SGn+1) and the signal line SBn−1 (SBn or SBn+1) as a between-adjacent line capacitor. Furthermore, it will be assumed that there is a capacitor Cbr between the signal line SBn−1 (or SBn) and the signal line SRn (SRn+1) as a between-adjacent line capacitor.

As shown in FIG. 11, the nondisplay area NDA2 is depicted as a circular hole section, and the diameter of the nondisplay area NDA2 is depicted as R_Hole. A gap between signal lines that bypass the nondisplay area NDA2 is depicted as Sig_gap_Hole. A gap between signal lines other than the signal lines that bypass the nondisplay area NDA2 is depicted as Sig_gap, and the total line length of a signal line is depicted as R_All.

Adjacent coupling voltages can be given by the following expressions.

$$\Delta Vred = Crg/Csig\_r \times Vgreen + Cbr/Csig\_r \times Vblue$$

$$\Delta Vgreen = Cgb/Csig\_g \times Vblue$$

Here, Vgreen and Vblue represent a write voltage for green color and a write voltage for blue color respectively.

Line capacitances of a signal line that bypasses the nondisplay area NDA2 are given by the following expressions.

$$Crg \text{ (a between-adjacent line capacitance)} = A/Sig\_gap$$
(a between-line distance)

$$Crg \text{ hole (a between-adjacent line capacitance between lines that bypass the nondisplay area NDA2)} = A/Sig\_gap\_Hole$$

Here, A is a constant determined by a line width and the like.

The line capacitance ratio K is given by the following equation. Here, the line capacitor ratio K is the ratio between "the capacitance between adjacent lines near the nondisplay area NDA2 (hole section)" and "the capacitance between adjacent lines far from the nondisplay area NDA2 (hole section)".

$$K = Crg\_hole/Crg = Sig\_gap/Sig\_gap\_Hole$$

Here, K is equal to about 10.

The correction of writing voltages will be explained below.

The capacitance between adjacent lines near the nondisplay area NDA2 (hole section):

$$Crg\_other\_all = R\_All \times Sig\_gap$$

The capacitance between adjacent lines far from the nondisplay area NDA2 (hole section):

$$Crg\_hole\_all = (R\_All - R\_Hole) \times Sig\_gap + Crg\_hole$$

$$\begin{aligned}
Crg\_hole\_all/Crg\_other\_all &= (R\_All \times Sig\_gap - R\_Hole \times \\
&\quad Sig\_gap + R\_hole \times Sig\_gap\_Hole)/ \\
&\quad (R\_All \times Sig\_gap) \\
&= (R\_All \times Sig\_gap + R\_Hole \times \\
&\quad (Sig\_gap\_Hole - Sig\_gap))/ \\
&\quad (R\_All \times Sig\_gap) \\
&= 1 + R\_Hole/R\_All \times \\
&\quad (Sig\_gap\_Hole - Sig\_gap)/Sig\_gap \\
&= 1 + (\text{the ratio of the hole section} \\
&\quad \text{size to the total line length}) \times \\
&\quad (K - 1) \\
&= 1 + (\text{the ratio of the hole section} \\
&\quad \text{size to the total line length}) \times \\
&\quad (\text{the gap between signal lines} \\
&\quad \text{in the hole section})
\end{aligned}$$

In other words, the line capacitance ratio K can be calculated from the ratio of the hole section size to the total line length and the gap between the signal lines in the hole section. Therefore, it is preferable that the correction voltages (VS) for the source potentials should be set so that the increment of the line capacitance ratio K is decreased.

According to this working example, because the potential shifts ΔV on the signal lines SRh and SGh as shown in FIG. 8 can be prevented from being generated by correcting the output voltages of the source amplifiers, it becomes possible to write predetermined potentials into plural subpixels Ps as pixel potentials. Therefore, the band-like stripes 300 shown in FIG. 7 are not generated, which leads to the improvement of the display quality of the display panel PNL.

First Alternation Example

Figure 12:
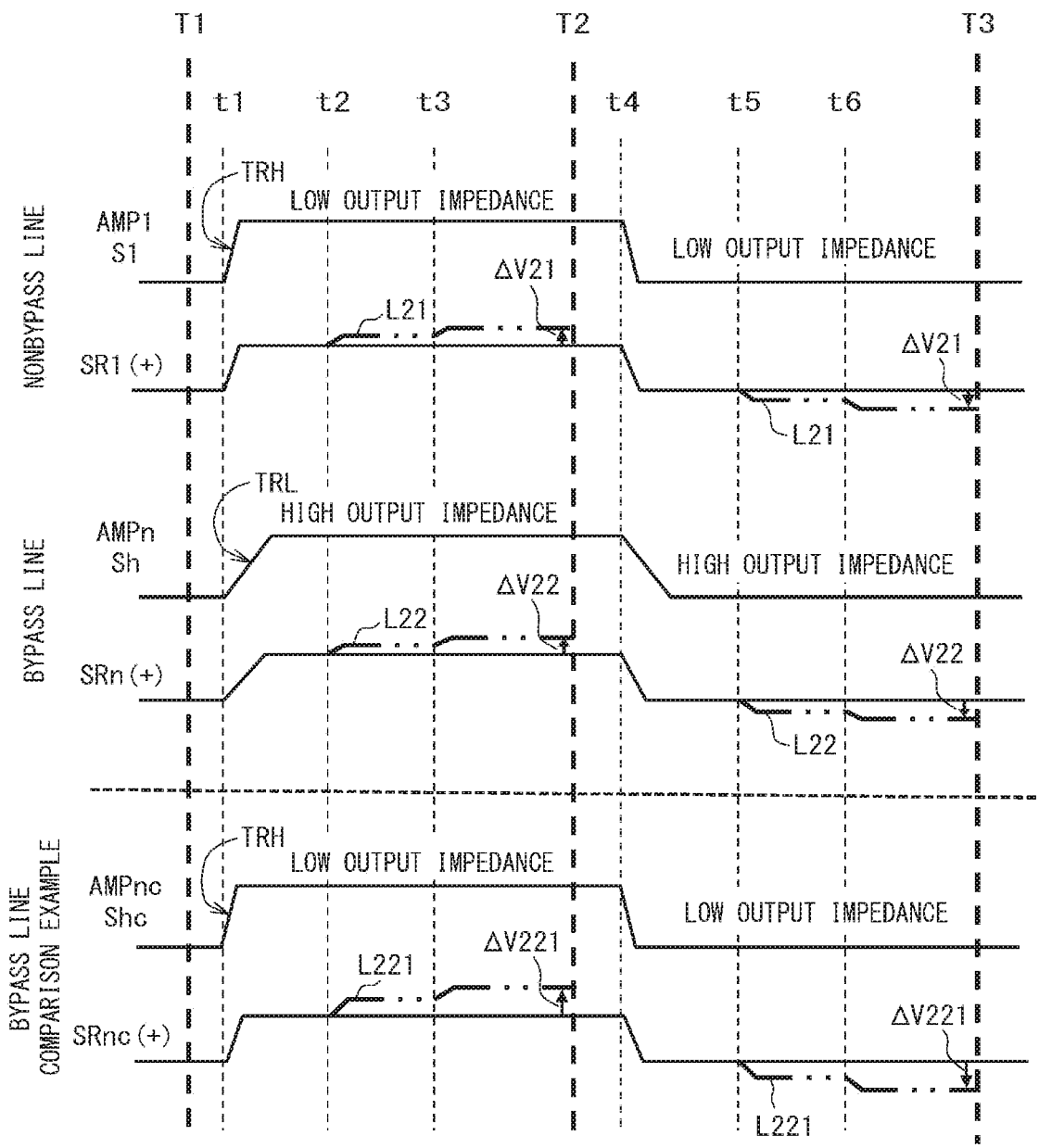
FIG. 12 is a diagram for explaining the changes of the signal potentials of signal lines according to a second drive scheme of a first alternation example.

FIG. 12 is a diagram for explaining the changes of the signal potentials of signal lines according to a second drive scheme of a first alternation example. The second drive scheme is a drive scheme in which the output impedances of source amplifiers that drive signal lines that bypass the nondisplay area NDA2 are set higher than the output impedances of source amplifiers that drive signal lines that do not bypass the nondisplay area NDA2. With this, the slew rates (the rising speeds of the drive waveforms) of the source amplifiers are adjusted. By setting the output impedances of the source amplifiers higher, the rising speeds of the source amplifiers are set slower (smaller). Therefore, in the second drive scheme, the drive circuit makes the rising speed of drive waveforms smaller as distances between adjacent signal lines corresponding to the drive circuit are shorter.

FIG. 12 shows the signal waveform of a signal line SR1 involving a nonbypass line, the signal waveform of a signal line SRn involving a bypass line, and the signal waveform of a signal line SRnc involving a bypass line, used as a comparative example. The signal line SR1 involving a nonbypass line corresponds to a signal line that does not bypass the nondisplay area NDA2. It will be assumed that the source signal S1 driven by the source amplifier AMP1 is supplied to the signal line SR1. As shown in FIG. 5, the signal line SRn involving a bypass line corresponds to a signal line that bypasses the nondisplay area NDA2. It will be assumed that the source signal Sh driven by the source amplifier AMPn is supplied to the signal line SRn. The signal line SRnc involving a bypass line and used as the comparative example corresponds to a signal line that bypass the nondisplay area NDA2. It will be assumed that the source signal Shc driven by the source amplifier AMPnc is supplied to the signal line SRnc.

As shown in FIG. 12, the output impedance of the source amplifier AMP1 is set lower, and the output impedance of the source amplifier AMPn is set higher. In other words, the output impedance of the source amplifier AMPn is set higher than that of the source amplifier AMP1. Because the output impedance of the source amplifier AMPn is set higher, the rising speed TRL of the drive waveform of the source signal Sh of the source amplifier AMPn is set slower (smaller) than the rising speed TRH of the drive waveform of the source signal S1 of the source amplifier AMP1.

On the other hand, the output impedance of the source amplifier AMPnc according to the comparative example is set low as is the case with the source amplifier AMP1, so that the rising speed TRH of the drive waveform of the source signal Shc is set substantially the same as the rising speed of TRH of the drive waveform of the source signal S1.

A coupling capacitor between the signal line SR1 involving a nonbypass line and its adjacent signal line is smaller than a coupling capacitor between the signal line SRn involving a bypass line and its adjacent signal line or a coupling capacitor between the signal line SRnc involving a bypass line and its adjacent signal line.

Because the coupling capacitor between the signal line SR1 involving the nonbypass line and its adjacent signal line is smaller, even if the signal line SR1 is driven by the source signal S1 driven by the source amplifier AMP1 having its low output impedance, a potential variation $\Delta V21$ generated by the influence of the coupling capacitor between the signal line SR1 and its adjacent signal line is comparatively small as shown by bold chain double-dashed lines L21. On the other hand, because the coupling capacitor between the signal line SRnc involving the bypass line according to the comparative example and its adjacent signal line is large, if the source signal Shc driven by the source amplifier AMPnc having its low output impedance is supplied, a potential variation $\Delta V221$ generated by the influence of the coupling capacitor between the signal line SRnc and its adjacent signal line becomes larger than the potential variation $\Delta V21$ ($\Delta V221 > \Delta V21$) as shown by bold chain double-dashed lines L221.

Although the coupling capacitor between the signal line SRn involving the bypass line and its adjacent signal line is larger, because the source signal Sh driven by the source amplifier AMPn having its high output impedance is supplied, a potential variation $\Delta V22$ generated by the influence of the coupling capacitor between the signal line SRn and its adjacent signal line can be set smaller than the potential variation $\Delta V221$ ($\Delta V22 < \Delta V221$) as shown by bold chain double-dashed lines L22. In addition, in this example, it is possible to make the potential variation $\Delta V22$ almost equal to or approximate the potential variation $\Delta 21$ ($\Delta V22 \cong \Delta V21$).

According to the first alternation example, by setting the output impedance of the source amplifier AMPn higher, a voltage coupling amount between the signal line SRn and its adjacent signal line can be canceled, so that, although the potential shift ($\Delta V22$) is generated, the visibility of the potential shift ($\Delta V22$) can be made lower in the display panel PNL.

Second Alternation Example

Figure 13:
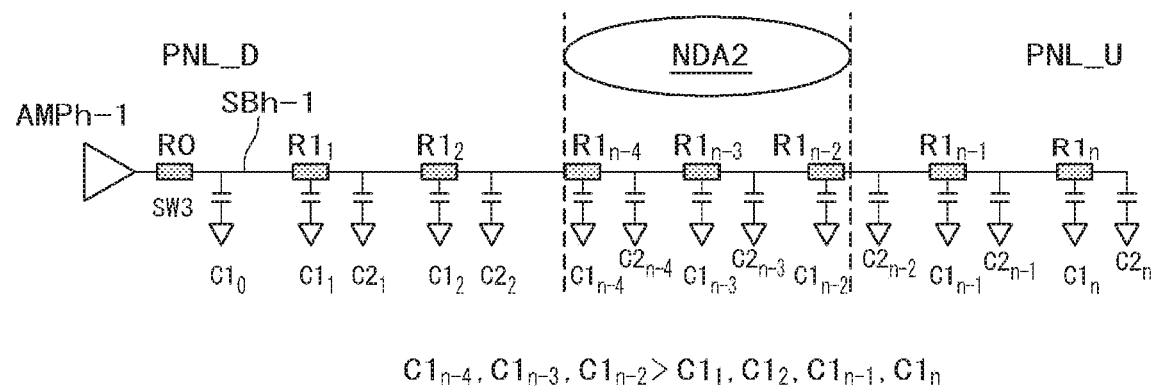
FIG. 13 is a diagram conceptually showing the parasitic resistors and parasitic capacitors of a signal line disposed in the vicinity of the nondisplay area.

FIG. 13 is a diagram conceptually showing the parasitic resistors and parasitic capacitors of a signal line disposed in the vicinity of a nondisplay area. In this example, the parasitic resistors and parasitic capacitors of the signal line SBh-1 disposed in the vicinity of the nondisplay area NDA2 are shown. It will be assumed that the signal line SBh-1 is driven by the source amplifier AMPh-1. In FIG. 13, the switch element SW3 is disposed on the lower edge side PNL_D of the display panel PNL, and the signal line SBh-1 is disposed so that the signal line SBh-1 passes the lower edge side PNL_D of the display panel PNL, passes (bypasses) the vicinity of the nondisplay area NDA2, and passes the upper edge side PNL_U of the display panel PNL. As shown in FIG. 13, the signal line SBh-1 has a parasitic resistor RO of the switch SW3, and line resistors $R1_1$ to $R1_n$ as parasitic resistors. Furthermore, the signal line SGh-1 has line capacitors $C1_1$ to $C1_n$ and pixel capacitors $C2_1$ to $C2_n$ belonging to the respective pixels as parasitic capacitors. In addition, in FIG. 13, it will be assumed that the line resistors $R1_{n-4}$ to $R1_{n-2}$, the line capacitors $C1_{n-4}$ to $C1_{n-2}$, and the pixel capacitors $C2_{n-4}$ to $C2_{n-2}$ are disposed in the vicinity of the nondisplay area NDA2. In this case the line capacitors $C1_{n-4}$ to $C1_{n-2}$ are larger than other line capacitors ($C1_1$, $C1_2$, $C1_{n-1}$, $C1_n$). Coupling capacitors between the signal line SBh-1 and the adjacent signal line SRh and scanning lines G (Refer to FIG. 5), which intersect with the signal line SBh-1, become larger, so that it is conceivable that the convergence of a pixel potential (a cumulated charge quantity) for each subpixel slows down.

Figure 14:
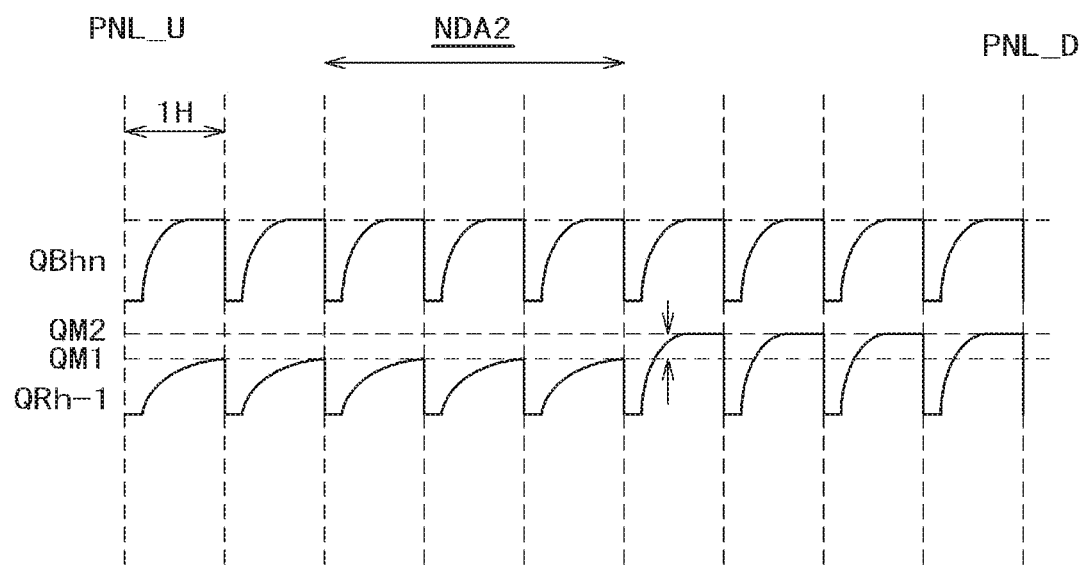
FIG. 14 is a diagram for explaining the convergences of pixel potentials (cumulated charge quantities) between the upper edge side and the lower edge side of the display panel.

FIG. 14 is a diagram for explaining the convergences of pixel potentials (cumulated charge quantities) between the upper edge side and the lower edge side of the display panel. In FIG. 14, the left side of FIG. 14 shows the upper edge side PNL_U of the display panel PNL, and the right side of FIG. 14 shows the lower edge side PNL_D of the display panel PNL. In FIG. 14, a signal line that does not bypass the nondisplay area NDA2 is represented as a signal line SBhn, for example, and the charge amounts of the signal line SBhn are represented as charge amounts QBhn. Instead of the signal line SBhn, the signal line SRh+2 or the signal line SGh+2 shown in FIG. 5 may be adopted. Furthermore, a signal line that bypasses the nondisplay area NDA2 is represented as a signal line SRh-1, and the charge amounts of the signal line SRh-1 are represented as charge amounts QRh-1. Instead of the signal line SRh-1, the signal line SRh, the signal line SGh, the signal line SRh+1, the signal line SGh+1, or the signal line SBh+1 shown in FIG. 5 may be adopted.

As shown in FIG. 14, the charge amounts QBhn of the signal line SBhn converge during one horizontal period 1H. On the other hand, the charge amounts QRh-1 of the signal line SRh-1 that exist in an area between the right side of the nondisplay area NDA2 and the lower edge side PNL_D of the display panel PNL converge during the one horizontal period 1H. However, the charge amounts QRh-1 of the signal line SRh-1 that exist in the nondisplay area NDA2 and in an area between the left side of the nondisplay area NDA2 and the upper edge side PNL_U of the display panel PNL do not converge during the one horizontal period 1H. In other words, the maximum values QM1 of the charge amounts QRh-1 of the signal line SRh-1 that exist in the nondisplay area NDA2 and in the area between the left side of the nondisplay area NDA2 and the upper edge side PNL_U of the display panel PNL are smaller than the maximum values QM2 of the charge amounts QRh-1 of the signal line SRh-1 that exist in the area between the right side of the nondisplay area NDA2 and the lower edge side PNL_D of the display panel PNL (QML<QM2). Therefore, it is impossible to write sufficiently large potentials into plural subpixels that exist in the nondisplay area NDA2 and in the area between the left side of the nondisplay area NDA2 and the upper edge side PNL_U of the display panel PNL.

Figure 15:
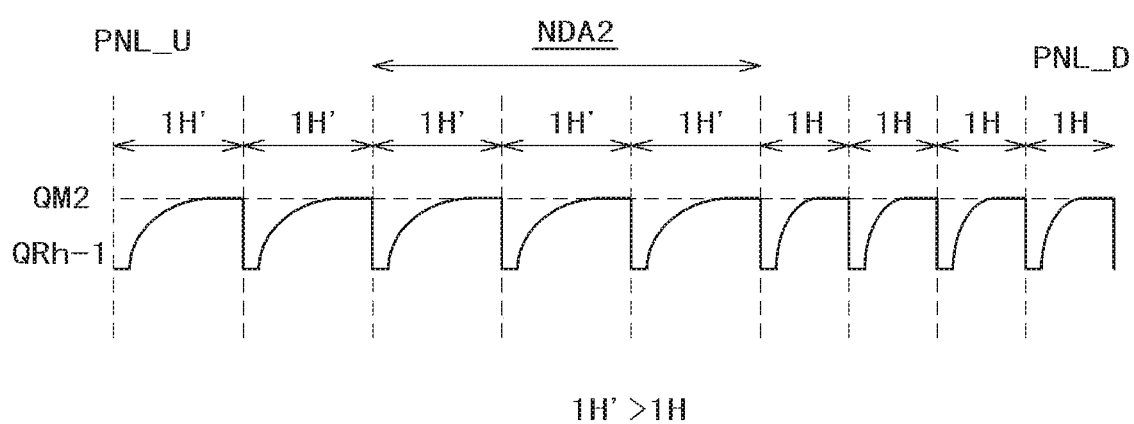
FIG. 15 is a diagram for explaining the convergences of pixel potentials (cumulated charge quantities) between the upper edge side and the lower edge side of the display panel according to a third drive scheme of a second alternation example.

FIG. 15 is a diagram for explaining the convergences of pixel potentials (cumulated charge quantities) between the upper edge side and the lower edge side of the display panel according to a third drive scheme of a second alternation example. In FIG. 15, the charge amounts QRh-1 of the signal line SRh-1 that exist in the area between the right side of the nondisplay area NDA2 and the lower edge side PNL_D of the display panel PNL converge at QM2 during one horizontal period 1H as is the case with FIG. 14. As shown in FIG. 15, in the nondisplay area NDA2 and in the area between the left side of the nondisplay area NDA2 and the upper edge side PNL_U of the display panel PNL, one horizontal period 1H', which is extended so as to be longer than the one horizontal period 1H, is set (1H'>1H), and the charge amounts QRh-1 of the signal line SRh-1 converges at QM2 during the extended one horizontal period 1H'. In other words, the third drive scheme is a drive scheme in which the drive time of the signal lines driven by the source amplifiers is set equal to the extended one horizontal period 1H' that is larger than the one horizontal period 1H. Therefore, in a third drive scheme, the drive circuit makes drive times longer as distances between adjacent signal lines corresponding to the drive circuit are shorter.

The setting of the extended one horizontal period 1H' can be done, for example, by extending the periods of selection levels for the respective selection signals ASWR, ASWG, and ASWB or the like. The setting of the extended one horizontal period 1H' can also be done by extending the periods of selection levels for the corresponding gate lines G by extending the clock generation interval of a shift clock among other ways. Alternatively, the setting of the extended one horizontal period 1H' can be done by extending both periods of selection levels for the respective selection signals ASWR, ASWG, and ASWB, and the clock generation interval of the shift clock. Here, the shift clock is used for sequentially selecting the plural scanning lines G.

According to the second alternation example, the write time of the potentials of source signal or the drive time of signal lines driven by source amplifiers for the plural subpixels that exist in the nondisplay area NDA2 and in the area between the left side of the nondisplay area NDA2 and the upper edge side PNL_U of the display panel PNL is securely set longer so that the write time or the drive time becomes equal the extended horizontal period 1H'. Therefore, it becomes possible to make charge amounts induced by the potentials of the source signals written into the plural subpixels converge to QM2.

(Configuration Example of IC Chip)

Figure 16:
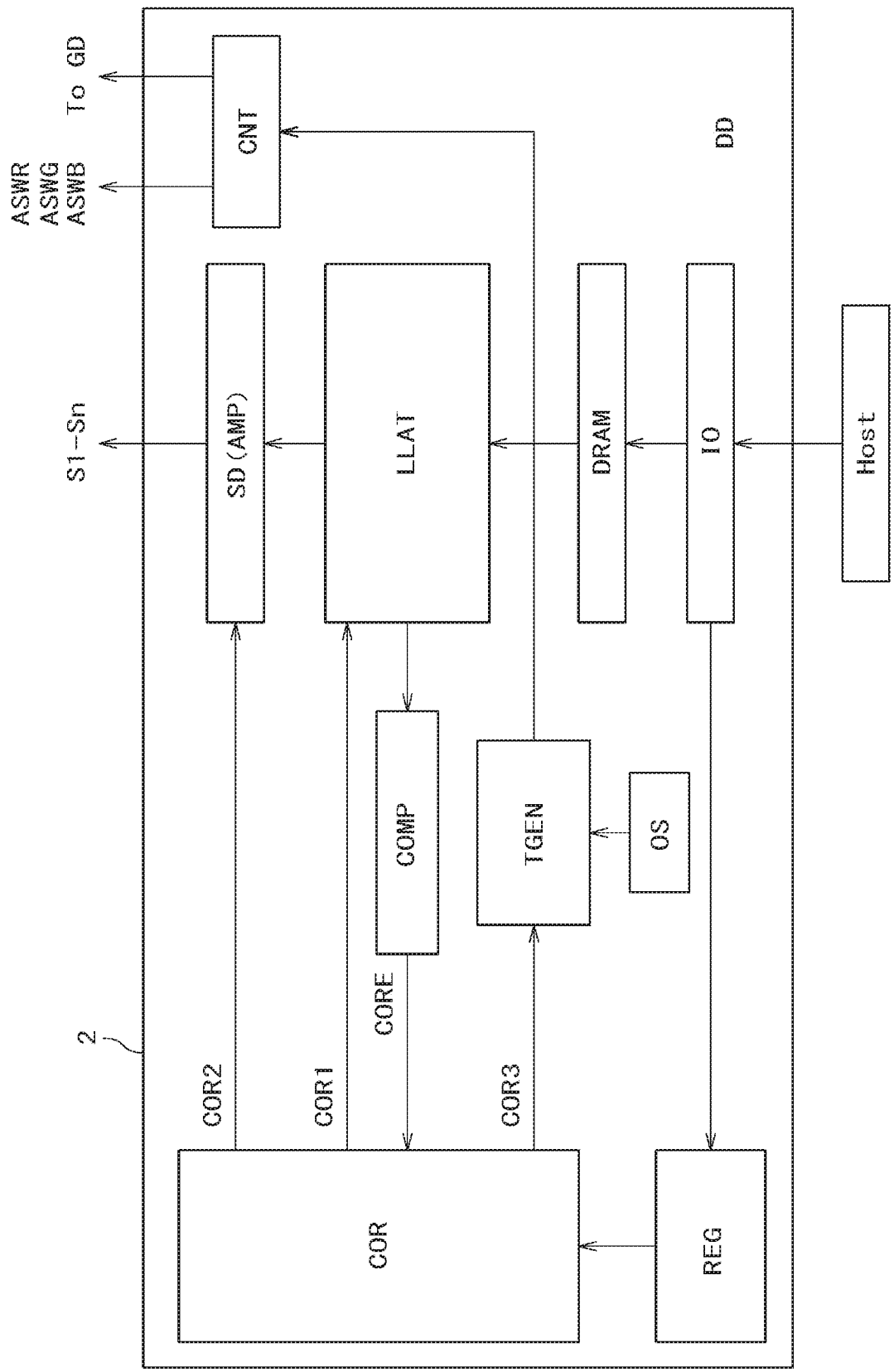
FIG. 16 is a diagram showing a configuration example of an IC chip according to the working example.

FIG. 16 is a diagram showing a configuration example of an IC chip according to the working example. As shown in FIG. 16, the IC chip 2, which is a control unit, includes an input/output circuit IO, a display memory DRAM, a line latch circuit LLAT, and a source line drive circuit SD. The IC chip 2 further includes an oscillation circuit OS, a timing control circuit TGEN, a panel control signal generation circuit CNT, a register REG, a display comparison circuit COMP, and a correction circuit COR.

The input/output circuit IO is connected to a host apparatus HOST, and the input/output circuit IO is supplied with input data such as image data to be displayed and setting data for the register REG by the host apparatus HOST. In addition, the input/output circuit IO outputs setting data set in the register REG and image data stored in the display memory DRAM to the host apparatus HOST in response to read command or the like issued by the host apparatus HOST.

The display memory DRAM stores, for example, image data for one frame of the display panel PNL. The image data for one frame is composed of image data for plural lines.

The line latch circuit LLAT stores image data for one line of the display panel PNL among the image data stored in the display memory DRAM. The display memory DRAM operates so as to output image data for plural lines that compose one frame one line by one line sequentially to the line latch circuit LLAT. Here, it is also conceivable that the line latch circuit LLAT is configured to store image data for the plural lines.

As shown in FIG. 4, the source line drive circuit SD includes plural source amplifiers AMP (AMP1, AMP2, ... ). The source line drive circuit SD generates plural source signals S1, S2, ... on the basis of image data for one line from the line latch circuit LLAT. The plural source signals S1, S2, ... are supplied to the signal line selection circuit SEL of the display panel PNL.

The oscillation circuit OS generates an operation clock signal for the IC chip 2.

The timing control circuit TGEN generates various types of timing signals on the basis of the operation clock signal.

The panel control signal generation circuit CNT generates a panel control signal on the basis of the timing signals supplied from the timing control circuit TGEN. The pane control signal includes selection signals ASWR, ASWG, ASWB, a scanning timing signal (the shift clock) for the scanning line drive circuit GD, and the like. The shift clock is used for sequentially selecting the plural scanning lines G.

The register REG stores, for example, setting information such as size information and position information regarding the size and position of the nondisplay area NDA2 disposed on the display panel PNL. The size information and the position information are provided from, for example, the host apparatus HOST. It is also conceivable that the size information and the position information can be replaced with the number information and the area information of the signal lines S and the number information and the area information of the scanning lines G of the display panel PNL.

The display comparison circuit COMP compares image data for one line with each other in order to judge whether the same patterns are displayed or not in the horizontal direction among the image data for the one line. Alternatively, the display comparison circuit COMP is used for judging whether there are the same patterns in the nondisplay area NDA2 and in the vicinity of the nondisplay area NDA2. If it is judged that the same patterns are displayed in the horizontal direction or there are the same patterns in the nondisplay area NDA2 and in the vicinity of the nondisplay area NDA2, the display comparison circuit COMP outputs a correction-valid signal CORE to the correction circuit COR.

The correction circuit COR can generate first correction data COR1, second correction data COR2, or third correction data COR3 on the basis of the setting information stored in the register REG. The correction circuit COR outputs, for example, any one of the first correction data COR1, the second correction data COR2, and the third correction data COR3 on the basis of the correction-valid signal CORE. In addition, it is also conceivable that the first correction data COR1, the second correction data COR2, and the third correction data COR3 are stored in advance in the register REG.

The first correction data COR1 relates to the first drive scheme explained using FIG. 9, and it is correction data for correcting the voltages of the source signals (Sh and Sh−1) supplied to the signal lines (SRh, SGh, and SBh) that are wired so as to bypass the nondisplay area NDA2. The first correction data COR1 is provided to the line latch circuit LLAT and used for correcting image data stored in the line latch circuit LLAT. For example, as for image data that is output from the display memory DRAM and stored in the line latch circuit LLAT, red image data and blue image data corresponding to the voltages of the source signals (Sh and Sh−1) are changed to corrected red image data and corrected blue image data respectively on the basis of the first correction data COR1. The corrected red image data and the corrected blue image data are configured to have values corrected in consideration of the influence of coupling.

The second correction data COR2 relates to the second drive scheme explained using FIG. 12 (the first alternation example), and it is correction data for setting the output impedances of source amplifiers that drive signal lines that bypass the nondisplay area NDA2 higher than the output impedances of source amplifiers that drive signal lines that do not bypass the nondisplay area NDA2. The second correction data COR2 is provided to the source line drive circuit SD and used for setting the output impedances of plural source amplifiers AMP. For example, it is conceivable that, in order to change the output impedances of the source amplifiers AMP from lower impedances to higher impedances, the gate widths of the output transistors of the source amplifiers are changed. In this case, a first output transistor with a gate having a narrow gate width and a second output transistor with a gate having a gate width wider than the gate width of the first transistor is fabricated in a source amplifier. In the case where the output impedance of the source amplifier is changed from a lower impedance to a higher impedance, the output transistor of the relevant source amplifier is changed from the second output transistor to the first output transistor on the basis of the second correction data COR2. With this, the slew rate of the source amplifier can be made smaller.

The third correction data COR3 relates to the third drive scheme explained using FIG. 15 (the second alternation example), and it is correction data for using the one horizontal period 1H' that is extended so as to be longer than the one horizontal period 1H (1H'>1H). The third correction data COR3 is provided to the timing control circuit TGEN and used for timing setting for extending the selection level periods of the respective selection signals ASWR, ASWG, and ASWB output from the panel control signal generation circuit CNT and the like. Alternatively, the third correction data COR3 is used for timing setting for generating the scanning timing signal (the shift clock) output from the panel control signal generation circuit CNT, timing setting for extending the interval of generating the scanning timing signal, and the like.

The IC chip 2 shown in FIG. 16 includes the correction circuit COR that generates the first correction data COR1, the second correction data COR2, and the third correction data COR3, but the correction circuit COR does not always have to be configured as such. The correction circuit COR can be configured to generate any one or two of the first correction data COR1, the second correction data COR2, and the third correction data COR3.

As shown in FIG. 16, by implementing the correction circuit COR and the register REG in the IC chip 2, the first drive scheme, the second drive scheme or the third drive scheme can be adopted. Therefore, without changing the configuration of the display panel PNL, the display quality of the display panel PNL can be improved by setting the IC chip 2 (by setting software used in the IC chip 2). Furthermore, in the case where there are plural display panels PNL, because the setting of an IC chip 2 for each display panel PNL can be adjusted, the display qualities of the plural display panels PNL can be improved regardless of the inch sizes and layouts of the respective display panels PNL.

Figure 17:
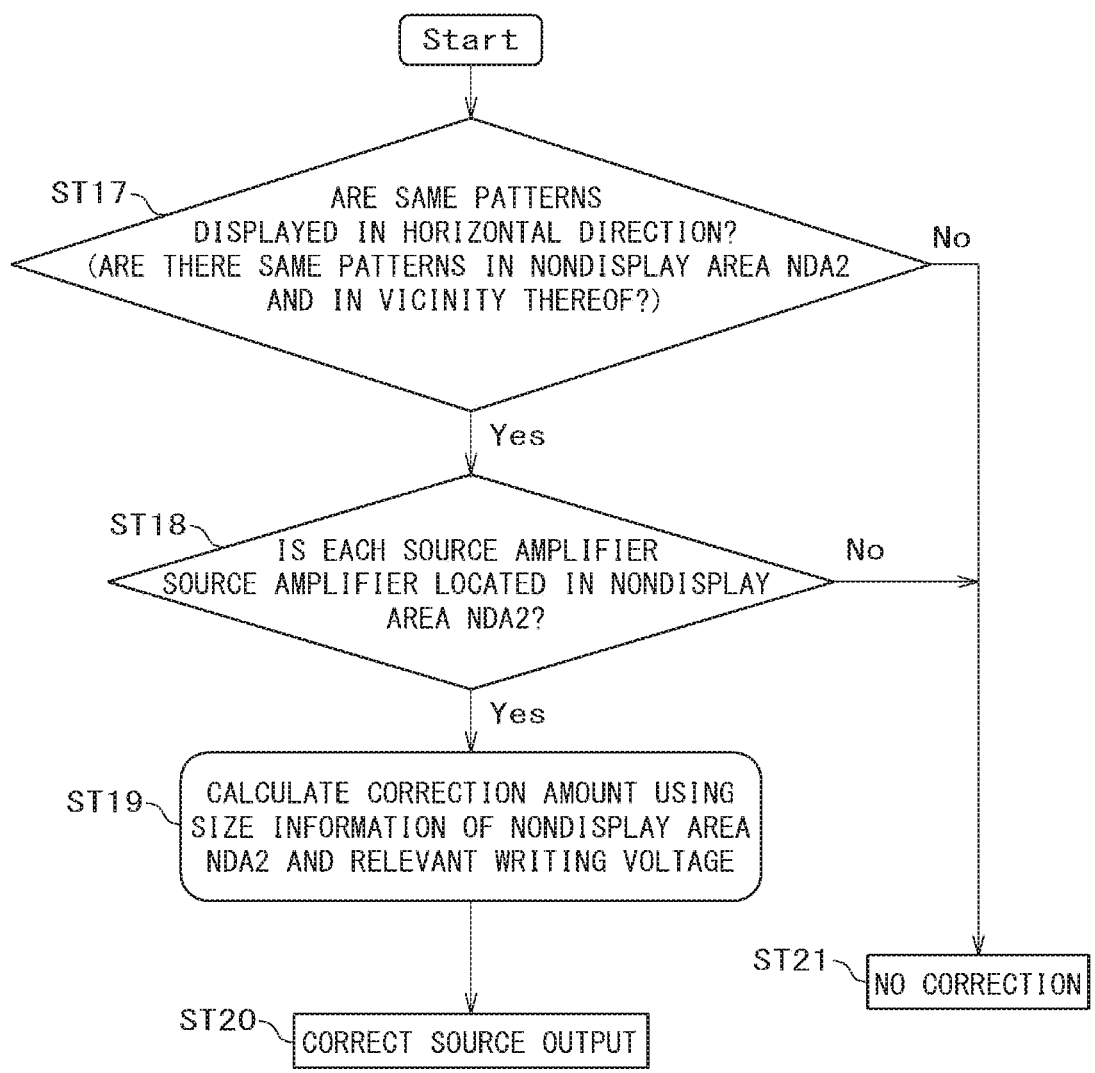
FIG. 17 is a diagram showing an operation flow for generating first correction data according to the first drive scheme.

FIG. 17 is a diagram showing an operation flow for generating the first correction data COR1 according to the first drive scheme. As shown in FIG. 17, at step ST17, whether the same patterns are displayed in the horizontal direction or not is judged by the display comparison circuit COMP. In other words, the display comparison circuit COMP judges whether or not there are the same patterns in the nondisplay area NDA2 and in the vicinity of the nondisplay area NDA2. If the answer to the judgment is No at step ST17, the flow proceeds to step ST21, and the correction is not performed. On the other hand, if the answer to the judgment is Yes at step ST17, the flow proceeds to step ST18.

At step ST18, the correction circuit COR takes up source amplifiers one by one and judges whether or not each source amplifier is a source amplifier located in the nondisplay area NDA2 on the basis of the setting information (the size information and position information about the nondisplay area NDA2 and the like) stored in the register REG. In other words, whether or not each source amplifier is a source amplifier corresponding to a signal line that bypasses the nondisplay area NDA2 is judged. If the answer to the judgment is No at step ST18, the flow proceeds to step ST21, and the correction is not performed. On the other hand, if the answer to the judgment is Yes at step ST18, the flow proceeds to step ST19.

At step S19, the correction circuit COR calculates a correction amount on the basis of the size information of the nondisplay area NDA2 and the relevant writing voltage stored in the register REG. The correction amount of the writing voltage has already been described in the explanations made using FIG. 10 and FIG. 11, and the flow proceeds to step ST20.

At step ST20, the output voltage of the relevant source signal is corrected on the basis of the correction amount calculated at step ST19. This correction is performed by changing the relevant red image data and the relevant blue image data stored in the line latch circuit LLAT into corrected red image data and corrected blue image data on the basis of the first correction data COR1.

(Application Areas)

Figure 18:
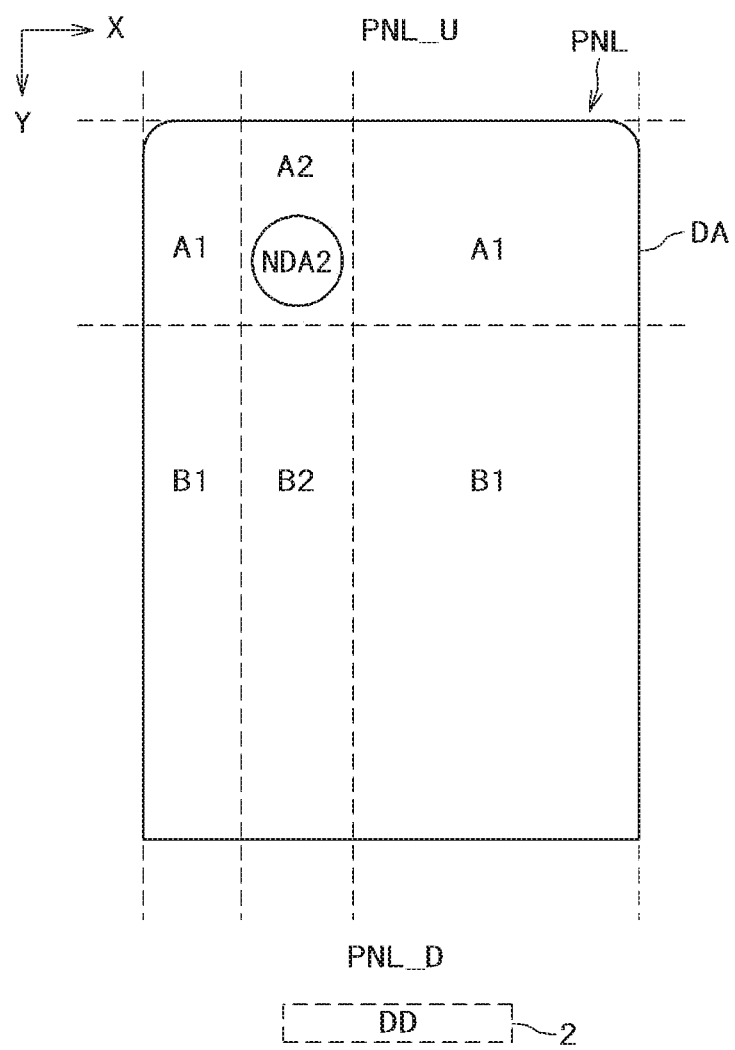
FIG. 18 is a diagram for explaining the application areas of the working example, the first alternation example, and the second alternation example in the plural areas of the display area of the display panel according to this embodiment.

FIG. 18 is a diagram for explaining the application areas of the working example, the first alternation example, and the second alternation example in the plural areas of the display area of the display panel according to this embodiment. First, the plural areas composing the display area DA of the display panel PNL will be explained.

As shown in FIG. 18, the display area DA of the display panel PNL includes plural first areas A1, a second area A2, plural third areas B1, and a fourth area B2. The plural first areas A1 and the second area A2 are disposed on the upper edge side PNL_U of the display panel PNL, and the plural third areas B1 and the fourth area B2 are disposed on the lower edge side PNL_D of the display panel PNL. The lower edge side PNL_D can be defined as an area side on which the IC chip 2 is disposed.

The second area A2 includes the nondisplay area NDA2 and an area to the upper side of the nondisplay area NDA2.

The fourth area B2 is an area disposed to the lower side of the second area A2 in a planar perspective. Signal lines that bypass the nondisplay area NDA2 are disposed in the second area A2 and the fourth area B2.

The plural first areas A1 are disposed to the left side and the right side of the second area A2 respectively so as to sandwich the second area A2 in a planar perspective. Scanning lines that bypass the nondisplay area NDA2 are disposed in the plural areas A1 and the second area A2.

The plural third areas B1 are disposed to the left side and the right side of the fourth area B2 so as to sandwich the fourth area B2 in a planar perspective. The plural third areas B1 and the fourth area B2 are areas where no scanning lines that bypass the nondisplay area NDA2 are disposed, so that plural scanning lines disposed in the plural third areas B1 and the fourth area B2 are disposed in substantially horizontal directions along the X direction.

The plural first areas A1 and the plural third areas B1 are areas where no signal lines that bypass the nondisplay area NDA2 are disposed, so that plural signal lines disposed in the plural first areas A1 and the plural third areas B1 are disposed in substantially vertical directions along the Y direction.

(Application Areas of First Drive Scheme)

The working example (the first drive scheme) shown in FIG. 9 is a scheme in which, as coupling capacitors between a single line and adjacent signal lines are larger, a drive voltage for the signal line is set smaller. Therefore, it is conceivable that the second area A2 is a correction target area or the second area A2 and the fourth area B2 are correction target areas according to this working example.

(Application Areas of Second Drive Scheme)

The alternation example 1 (the second drive scheme) shown in FIG. 12 is a scheme in which, as coupling capacitors between a single line and adjacent signal lines are larger, the rising speed (slew rate) of a drive waveform for the signal line is set smaller. Therefore, it is conceivable that the second area A2 is a correction target area or the second area A2 and the fourth area B2 are correction target areas according to the first alternation example.

(Application Areas of Third Drive Scheme)

The alternation example 2 (the third drive scheme) shown in FIG. 15 is a scheme in which, the drive time for driving a signal line by a source amplifier is set longer. Therefore, correction target areas according to the second alternation example can be any of the following cases.

1) The First Areas A1 and the Second Area A2

In this case, the extended one horizontal period 1H' is applied to the first areas A1 and the second area A2, and the one horizontal period 1H, which is shorter than the extended one horizontal period 1H', is applied to the third areas B1 and the fourth area B2 (1H<1H').

2) The Second Area A2

In this case, the extended one horizontal period 1H' is applied to the second area A2, and the one horizontal period 1H, which is shorter than the extended one horizontal period 1H', is applied to the first areas A1, the third areas B1, and the fourth area B2 (1H<1H').

3) The Second Area A2 and the Fourth Area B2

In this case, the extended one horizontal period 1H' is applied to the second area A2 and the fourth area B2, and the one horizontal period 1H, which is shorter than the extended one horizontal period 1H', is applied to the first areas A1 and the third areas B1 (1H<1H').

4) The Second Area A2 and the Fourth Area B2

In this case, an extended first one horizontal period 1H'1 is applied to the second area A2. An extended second one horizontal period 1H'2, which is shorter than the extended first one horizontal period 1H'1, is applied to the fourth area B2 (1H'2<1H'1). The one horizontal period 1H, which is shorter than the extended first one horizontal period 1H'1 and the extended second one horizontal period 1H'2, is applied to the first areas A1 and the third areas B1 (1H<1H'2<1H'1).

All display devices, which, on the basis of the above-described display devices as the embodiments according to the present invention, those skilled in the art can implement by appropriately changing the designs of the above-described display devices, will fall within the scope of the present invention as long as all the display devices do not deviate from the gist of the present invention.

It should be understood that, if various alternation examples and modification examples are easily conceived by those skilled in the art within the idea of the present invention, those alternation examples and modification examples fall within the scope of the present invention. For example, devices obtained in the case where those skilled in the art appropriately add components to the above-described various embodiments, delete components from the above-described various embodiments, add processes to original processes for the above-described various embodiments, omit processes from the original processes, or alter conditions for implementing the above-described various embodiments fall within the scope of the present invention as long as the devices do not deviate from the gist of the present invention.

In addition, it should naturally be understood that, among other operational advantages brought about by the working examples described in the embodiments of the present invention, operational advantages, which are explicitly described in this specification or can easily be conceived by those skilled in the art, are brought about by the present invention.

Various inventions can be achieved by appropriately combining plural components disclosed in the above embodiments. For example, an invention may be achieved by deleting some components from all the components used in an embodiment. Furthermore, another invention may be achieved by appropriately combining components used in different embodiments.

What is claimed is:

1. A display device comprising a display panel including a plurality of signal lines, a plurality of scanning lines, and a plurality of pixels that are connected to the plurality of signal lines and the plurality of scanning lines and surrounded by the plurality of signal lines and the plurality of scanning lines, wherein the display panel includes:
a display area and an optically transparent nondisplay area inside the display area; and
a drive circuit for driving the plurality of signal lines, and
wherein the drive circuit includes at least one drive scheme of:
a first drive scheme in which the drive circuit makes drive voltages smaller as distances between adjacent signal lines corresponding to the drive circuit are shorter;
a second drive scheme in which the drive circuit makes the rising speed of drive waveforms smaller as distances between adjacent signal lines corresponding to the drive circuit are shorter; and a third drive scheme in which the drive circuit makes drive times longer as distances between adjacent signal lines corresponding to the drive circuit are shorter.

2. The display device according to claim 1, wherein the display area of the display panel includes a first area, a second area, a third area, and a fourth area, wherein the first area and the second area are disposed on the upper side of the display panel viewed in a planar perspective, wherein the third area and the fourth area are disposed on the lower side of the display panel viewed in a planar perspective, wherein the second area includes the nondisplay area, wherein the fourth area is disposed to the lower side of the second area viewed in a planar perspective, wherein the first area is disposed to the left side and the right side of the second area so as to sandwich the second area viewed in a planar perspective, wherein the third area is disposed to the left side and the right side of the fourth area so as to sandwich the fourth area viewed in a planar perspective, and wherein signal lines and scanning lines disposed in the second area are disposed in the periphery of the non-display area so as to bypass the nondisplay area.

3. The display device according to claim 2, wherein, in the case where the first drive scheme is selected, the signal lines disposed in the second area are driven using the first drive scheme.

4. The display device according to claim 2, wherein, in the case where the first drive scheme is selected, the signal lines disposed in the second area and in the fourth area are driven using the first drive scheme.

5. The display device according to claim 2, wherein, in the case where the second drive scheme is selected, the signal lines disposed in the second area are driven using the second drive scheme.

6. The display device according to claim 2, wherein, in the case where the second drive scheme is selected, the signal lines disposed in the second area and in the fourth area are driven using the second drive scheme.

7. The display device according to claim 2, wherein, in the case where the third drive scheme is selected, the signal lines disposed in the first area and in the second area are driven using the third drive scheme.

8. The display device according to claim 2, wherein, in the case where the third drive scheme is selected, the signal lines disposed in the second area are driven using the third drive scheme.

9. The display device according to claim 2, wherein, in the case where the third drive scheme is selected, the signal lines disposed in the second area and in the fourth area are driven using the third drive scheme.

10. The display device according to claim 2, wherein, in the case where the third drive scheme is selected, drive times for the signal lines disposed in the second area are set longer than drive times for the signal lines disposed in the fourth area, and drive times for the signal lines disposed in the first area and in the third area are set shorter than the drive times for the signal lines disposed in the fourth area.

11. The display device according to claim 1, wherein each of the plurality of pixels includes a plurality of sub-pixels, and wherein each of the plurality of sub-pixels is time-divisionally driven using switch elements.

12. The display device according to claim 11, wherein the plurality of sub-pixels include red pixels, green pixels, and blue pixels.

13. The display device according to claim 1, wherein the display device is a liquid crystal display device.

14. The display device according to claim 1, wherein each of the plurality pixels includes an organic light-emitting diode.

15. The display device according to claim 1, wherein the display panel includes a control unit for controlling the drive circuit, wherein the control unit includes a register, and wherein the plurality of signal lines are driven using the first drive scheme, the second drive scheme, or the third drive scheme on the basis of a value set by the register.

* * * * *